US008877616B2

(12) United States Patent
Pinguet et al.

(10) Patent No.: US 8,877,616 B2
(45) Date of Patent: Nov. 4, 2014

(54) METHOD AND SYSTEM FOR MONOLITHIC INTEGRATION OF PHOTONICS AND ELECTRONICS IN CMOS PROCESSES

(75) Inventors: Thierry Pinguet, Cardiff-by-the-Sea, CA (US); Steffen Gloeckner, San Diego, CA (US); Peter De Dobbelaere, San Diego, CA (US); Sherif Abdalla, Carlsbad, CA (US); Daniel Kucharski, Carlsbad, CA (US); Gianlorenzo Masini, Carlsbad, CA (US); Kosei Yokoyama, San Diego, CA (US); John Guckenberger, San Diego, CA (US); Attila Mekis, Carlsbad, CA (US)

(73) Assignee: Luxtera, Inc., Carlsbad, CA (US)

( * ) Notice: Subject to any disclaimer, the term of this patent is extended or adjusted under 35 U.S.C. 154(b) by 815 days.

(21) Appl. No.: 12/554,449

(22) Filed: Sep. 4, 2009

(65) Prior Publication Data
US 2010/0059822 A1    Mar. 11, 2010

Related U.S. Application Data

(60) Provisional application No. 61/199,353, filed on Nov. 14, 2008, provisional application No. 61/191,479, filed on Sep. 8, 2008.

(51) Int. Cl.
*H01L 27/12*    (2006.01)
*H01L 21/782*   (2006.01)
*H01L 21/84*    (2006.01)

(52) U.S. Cl.
CPC ............ *H01L 27/1203* (2013.01); *H01L 21/84* (2013.01)
USPC ........... 438/481; 438/191; 438/194; 438/199; 438/544; 257/351

(58) Field of Classification Search
CPC ............ H01L 27/0688; H01L 27/1203; H01L 27/14643; H01L 21/84
USPC .......................... 438/191, 194, 199, 481, 544
See application file for complete search history.

(56) References Cited

U.S. PATENT DOCUMENTS 4,685,199 A * 8/1987 Jastrzebski .................... 438/154
6,391,214 B1 * 5/2002 Kovacic .......................... 216/24
(Continued)

OTHER PUBLICATIONS

Mekis et al. "Monolithic integration of photonic and electronic circuits in a CMOS process," Proceedings SPIE, vol. 6897, p. 68970L 1-3, Feb. 12, 2008.*

(Continued)

*Primary Examiner* — Matthew W Such
*Assistant Examiner* — David Spalla
(74) *Attorney, Agent, or Firm* — McAndrews Held & Malloy

(57) ABSTRACT

Methods and systems for monolithic integration of photonics and electronics in CMOS processes are disclosed and may include fabricating photonic and electronic devices on a single CMOS wafer with different silicon layer thicknesses. The devices may be fabricated on a semiconductor-on-insulator (SOI) wafer utilizing a bulk CMOS process and/or on a SOI wafer utilizing a SOI CMOS process. The different thicknesses may be fabricated utilizing a double SOI process and/ or a selective area growth process. Cladding layers may be fabricated utilizing one or more oxygen implants and/or utilizing CMOS trench oxide on the CMOS wafer. Silicon may be deposited on the CMOS trench oxide utilizing epitaxial lateral overgrowth. Cladding layers may be fabricated utilizing selective backside etching. Reflective surfaces may be fabricated by depositing metal on the selectively etched regions. Silicon dioxide or silicon germanium integrated in the CMOS wafer may be utilized as an etch stop layer.

24 Claims, 18 Drawing Sheets

(56) References Cited

U.S. PATENT DOCUMENTS

| | | | |
|---|---|---|---|
| 6,645,829 B2 | 11/2003 | Fitzgerald | |
| 6,809,753 B2 * | 10/2004 | Tu | 347/239 |
| 7,110,629 B2 * | 9/2006 | Bjorkman et al. | 385/14 |
| 7,169,654 B2 | 1/2007 | Zia et al. | |
| 7,265,006 B2 * | 9/2007 | Augusto et al. | 438/191 |
| 7,454,102 B2 * | 11/2008 | Keyser et al. | 385/36 |
| 7,510,904 B2 * | 3/2009 | Chu et al. | 438/94 |
| 7,800,192 B2 * | 9/2010 | Venezia et al. | 257/432 |
| 8,260,151 B2 * | 9/2012 | Pelley et al. | 398/200 |
| 2004/0114853 A1 | 6/2004 | Bjorkman | |
| 2005/0205930 A1 | 9/2005 | Williams | |
| 2007/0117392 A1 * | 5/2007 | Smith et al. | 438/689 |

OTHER PUBLICATIONS

Reed et al. "Silicon Photonics," John Wiley & Sons, Ltd., Published Online: Jan. 28, 2005. Ch. 5, epecially p. 112-113, 119; hhtp://www.scribd.com/doc/16410866/Silicon-Photonics.*

PCT Notification Concerning Transmittal of International Preliminary Report on Patentability, in PCT/US2009/056213, dated Mar. 17, 2011.

International Search Report, PCT/US2009/056213, mailed Nov. 3, 2009.

Mekis et al., "Monolithic integration of photonic and electronic circuits in a CMOS process," Proceedings SPIE, vol. 6897, p. 68970L 1-3, Feb. 12, 2008, Fig 1-3; p. 68970L-1, 68970L-2, 68970L-3 [online]. Retrieved from the Internet on [Oct. 19, 2009]. Retrieved from: <URL: http://spiedl.aip.org/getpdf/servlet/GetPDFServlet?filetype=pdf&id=PSISDG00689700000168970L000001&idtype=cvips&prog=normal.

Reed et al., "Silicon Photonics," John Wiley & Sons, Ltd., Published Online: Jan. 28, 2005, Entire document, especially: chapter 5—p. 112-113, 119; Fig 5.2 [online]. Retrieved from the Internet on [Oct. 19, 2009]. Retrieved from: <URL: http://www.scribd.com/doc/16410866/Silicon-Photonics.

Muller et al., "Silicon-compatible waveguides used for an integrated opto-mechanical pressure sensor," Optical Materials vol. 17, No. 1-2, p. 255-258, Jun.-Jul. 2001, Fig 2; p. 256 [online]. Retrieved from the Internet on [Oct. 19, 2009]. Retrieved from: <URL: http://www.sciencedirect.com/science?_ob=MImg&_imagekey=B6TXP-43F9B3S-21-10&_cdi=5596&_user=952835&_orig=search&_coverDate=07%2F312F2001&_sk=999829998&view=c&wchp=dGLbVtz-zSkzk&md5=f6cfb7d385348450b6ec14a056e29658&ie=/ http://www.sciencedirect.com/science?_ob=MImg&_imagekey=B6TXP-43F9B3S-21-10&_cdi=5596&_user=952835&_orig=search&_coverDate=07%2F312F2001&_sk=999829998&view=c&wchp=dGLbVtz-zSkzk&md5=f6cfb7d385348450b6ec14a056e29658&ie=/sdarticle.pdf.

European Patent Office, Communication with extended European search report, in Application No. 09812368.0, dated Jun. 3, 2013.

Weiquan Zhang et al., "Building hybrid active pixels for CMOS imager on SOI substrate", SOI Conference, 1999, Proceedings, 1999 IEEE International Rohnert Park, CA, USA, Oct. 4-7, 1999, Piscataway, NJ, USA, IEEE, US, Oct. 4, 1999, pp. 102-103, XP010370234, DOI: 10.1109/SOI.1999.819873, ISBN: 978-0-7803-5456-2 * the whole document * figure 1 *.

Chinese Patent Office, First Office Action Issued by State Intellectual Property Office, in Application No. 200980139256.8, dated Aug. 8, 2013.

Raluca Muller, "Silicon-compatible Waveguides Used for an Integrated Optomechanical Pressure Sensor", Optical Materials, vol. 17, Jul. 31, 2001, pp. 255-258.

* cited by examiner

METHOD AND SYSTEM FOR MONOLITHIC INTEGRATION OF PHOTONICS AND ELECTRONICS IN CMOS PROCESSES

CROSS-REFERENCE TO RELATED APPLICATIONS/INCORPORATION BY REFERENCE

This application makes reference to and claims priority to U.S. Provisional Application Ser. No. 61/191,479 filed on Sep. 8, 2008, and Provisional Application Ser. No. 61/199,353 filed on Nov. 14, 2008, which are hereby incorporated herein by reference in their entirety.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to semiconductor processing. More specifically, certain embodiments of the invention relate to a method and system for monolithic integration of photonics and electronics in CMOS processes.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for monolithic integration of photonics and electronics in CMOS processes, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for monolithic integration of photonics and electronics in CMOS processes. Exemplary aspects of the invention may comprise fabricating photonic and electronic devices on a single complementary metal-oxide semiconductor (CMOS) wafer with different silicon layer thicknesses for the photonic and the electronic devices. The electronic and photonic devices may be fabricated on a semiconductor-on-insulator (SOI) wafer utilizing a bulk CMOS process. The electronic and photonic devices may be fabricated on a SOI wafer utilizing a SOI CMOS process. The different silicon layer thicknesses may be fabricated utilizing a double SOI process and/or a selective area growth process. Cladding layers for the photonic devices may be fabricated utilizing one or more oxygen implants into the CMOS wafer and/or utilizing CMOS trench oxide on the CMOS wafer. Silicon material for the photonic devices may be deposited on the CMOS trench oxide utilizing epitaxial lateral overgrowth. Cladding layers for the photonic devices may be fabricated utilizing selective backside etching regions of the CMOS wafer below the photonic devices. Reflective surfaces for the photonic devices may be fabricated by depositing metal on the selectively etched regions of the CMOS wafer. Silicon dioxide integrated in the CMOS wafer using oxygen implant may be utilized as an etch stop layer for the backside etching. Silicon germanium integrated in the CMOS wafer may be utilized as an etch stop layer for the backside etching. Photonic and electronic devices may be fabricated on two complementary metal-oxide semiconductor (CMOS) wafers with different silicon layer thicknesses for the photonic and the electronic devices by bonding at least a portion of each of the wafers together, where one of the CMOS wafers comprises the photonic devices and the other CMOS wafer comprises the electronic devices.

Figure 1A:
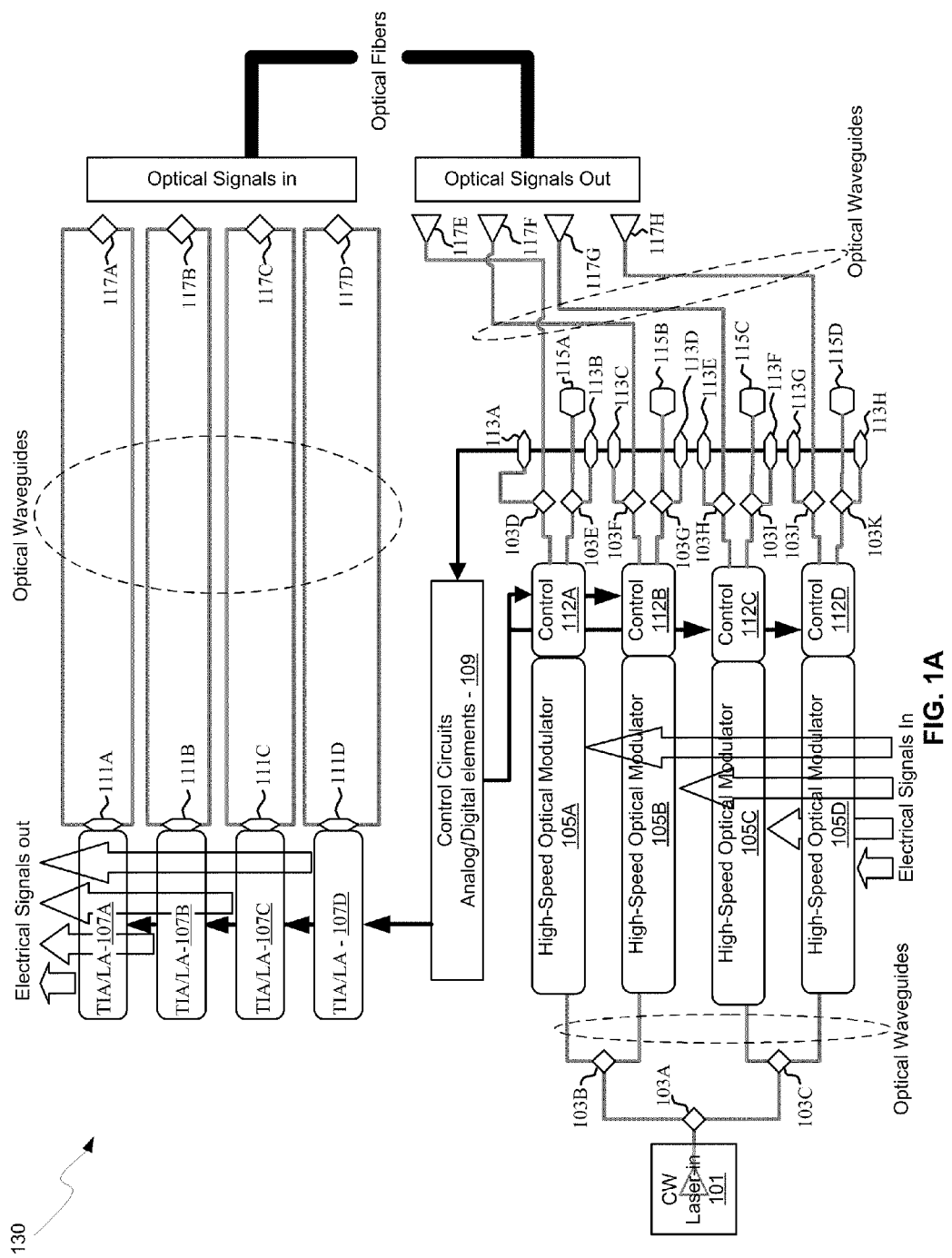
FIG. 1A is a block diagram of a photonically enabled CMOS chip, in accordance with an embodiment of the invention.

FIG. 1A is a block diagram of a photonically enabled CMOS chip, in accordance with an embodiment of the invention. Referring to FIG. 1A, there is shown optoelectronic devices on a CMOS chip 130 comprising high speed optical modulators 105A-105D, high-speed photodiodes 111A-111D, monitor photodiodes 113A-113H, and optical devices comprising taps 103A-103K, optical terminations 115A-115D, and grating couplers 117A-117H. There is also shown electrical devices and circuits comprising transimpedance and limiting amplifiers (TIA/LAs) 107A-107D, analog and digital control circuits 109, and control sections 112A-112D. Optical signals are communicated between optical and optoelectronic devices via optical waveguides fabricated in the CMOS chip 130. Additionally, optical waveguides are indicated in FIG. 1A by the dashed ovals.

The high speed optical modulators 105A-105D comprise Mach-Zehnder or ring modulators, for example, and enable the modulation of the CW laser input signal. The high speed optical modulators 105A-105D are controlled by the control sections 112A-112D, and the outputs of the modulators are optically coupled via waveguides to the grating couplers 117E-117H. The taps 103D-103K comprise four-port optical couplers, for example, and are utilized to sample the optical signals generated by the high speed optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the CMOS chip 130. The grating couplers 117A-117D are utilized to couple light received from optical fibers into the CMOS chip 130, and may comprise polarization independent grating couplers. The grating couplers 117E-117H are utilized to couple light from the CMOS chip 130 into optical fibers. The optical fibers may be epoxied, for example, to the CMOS chip 130, and may be aligned at an angle from normal to the surface of the CMOS chip 130 to optimize coupling efficiency.

The high-speed photodiodes 111A-111D convert optical signals received from the grating couplers 117A-117D into electrical signals that are communicated to the TIA/LAs 107A-107D for processing. The analog and digital control circuits 109 may control gain levels or other parameters in the operation of the TIA/LAs 107A-107D. The TIA/LAs 107A-107D may then communicate electrical signals to other circuitry on the CMOS chip 130 and/or circuitry/devices off-chip.

The TIA/LAs 107A-107D may comprise narrowband, non-linear optoelectronic receiver circuitry. Accordingly, the narrowband receiver front-end may be followed by a non-return to zero (NRZ) level restorer circuit. This circuit limits the bandwidth of the optical receiver in order to decrease the integrated noise, thereby increasing the signal to noise ratio. An NRZ level restorer may be used to convert the resulting data pulses back into NRZ data.

The control sections 112A-112D comprise electronic circuitry that enable modulation of the CW laser signal received from the taps 103A-103C. The high speed optical modulators 105A-105D require high-speed electrical signals to modulate the refractive index in respective branches of a Mach-Zehnder interferometer (MZI), for example. The voltage swing required for driving the MZI is a significant power drain in the CMOS chip 130. Thus, if the electrical signal for driving the modulator may be split into domains with each domain traversing a lower voltage swing, power efficiency is increased.

In an embodiment of the invention, the integration of all optical, electrical and optoelectronic devices required for a transceiver, along with a coupled laser source, enables the integration of multiple optoelectronic transceivers on a single chip. In an exemplary embodiment, the CMOS chip 130 comprises four optoelectronic transceivers with one optical source, and enables communication of optical signals vertically to and from the chip surface, thus enabling the use of CMOS processes, including a CMOS guard ring, as discussed with respect to FIGS. 1B and 1C.

Figure 1B:
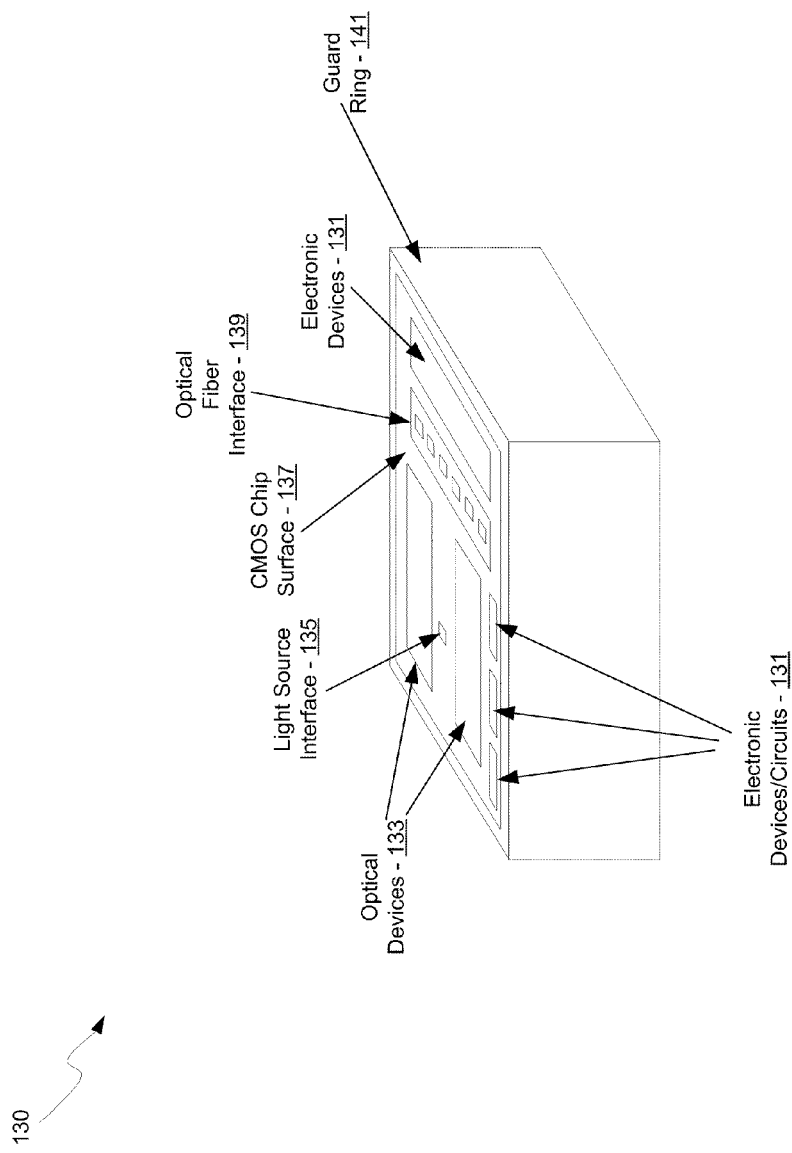
FIG. 1B is a diagram illustrating an oblique view of an exemplary photonically enabled CMOS chip, in accordance with an embodiment of the invention.

FIG. 1B is a diagram illustrating an oblique view of an exemplary photonically enabled CMOS chip, in accordance with an embodiment of the invention. Referring to FIG. 1B, there is shown the CMOS chip 130 comprising electronic devices/circuits 131, optical and optoelectronic devices 133, a light source interface 135, CMOS chip surface 137, an optical fiber interface 139, and CMOS guard ring 141.

The light source interface 135 and the optical fiber interface 139 comprise grating couplers that enable coupling of light signals via the CMOS chip surface 137, as opposed to the edges of the chip as with conventional edge-emitting devices. Coupling light signals via the CMOS chip surface 137 enables the use of the CMOS guard ring 141 which protects the chip mechanically and prevents the entry of contaminants via the chip edge.

The electronic devices/circuits 131 comprise circuitry such as the TIA/LAs 107A-107D and the analog and digital control circuits 109 described with respect to FIG. 1A, for example. The optical and optoelectronic devices 133 comprise devices such as the taps 103A-103K, optical terminations 115A-115D, grating couplers 117A-117H, high speed optical modulators 105A-105D, high-speed photodiodes 111A-111D, and monitor photodiodes 113A-113H.

Figure 1C:
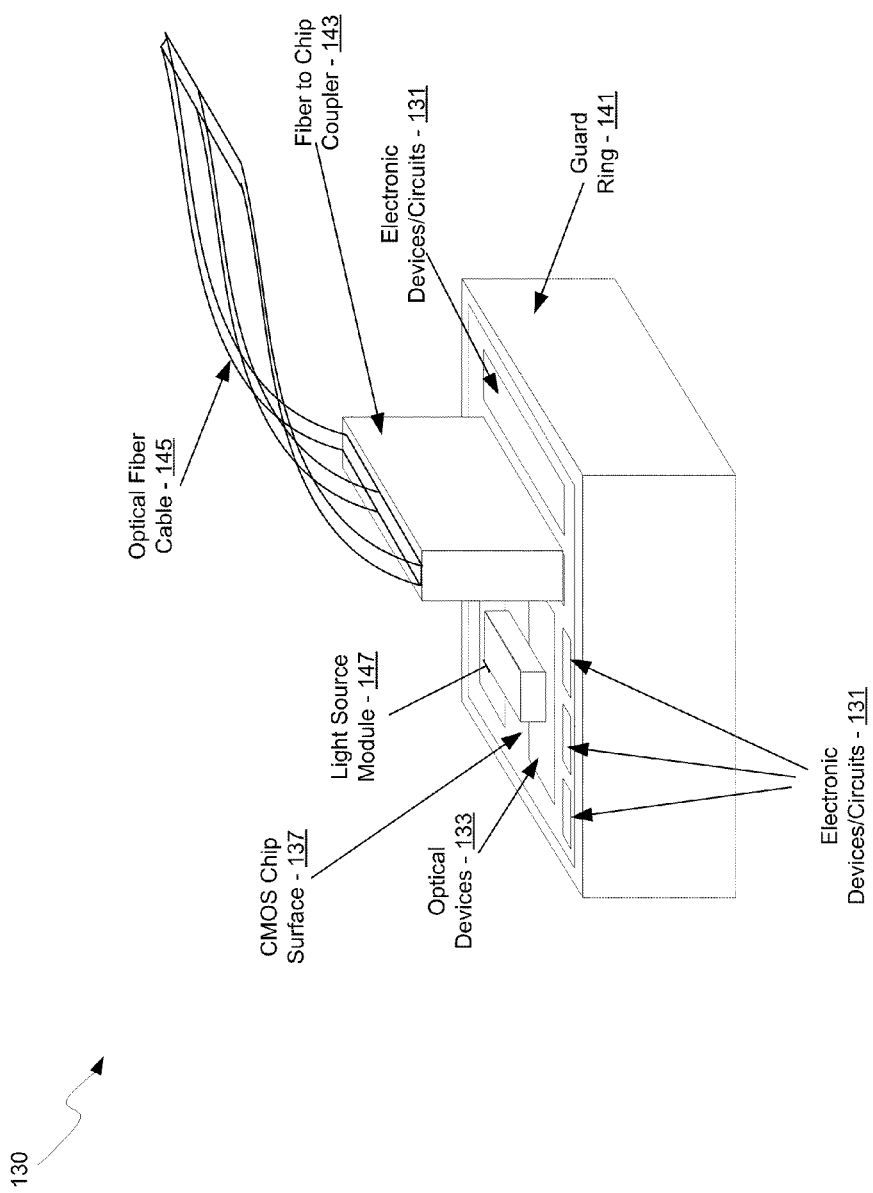
FIG. 1C is a diagram illustrating an exemplary CMOS chip coupled to an optical fiber cable, in accordance with an embodiment of the invention.

FIG. 1C is a diagram illustrating an exemplary CMOS chip coupled to an optical fiber cable, in accordance with an embodiment of the invention. Referring to FIG. 1C, there is shown the CMOS chip 130 comprising the electronic devices/circuits 131, the optical and optoelectronic devices 133, the CMOS chip surface 137, and the CMOS guard ring 141. There is also shown a fiber to chip coupler 143, an optical fiber cable 145, and a light source module 147.

The CMOS chip 130 comprising the electronic devices/circuits 131, the optical and optoelectronic devices 133, the CMOS chip surface 137, and the CMOS guard ring 141 may be as described with respect to FIG. 1B.

In an embodiment of the invention, the optical fiber cable may be affixed, via epoxy for example, to the CMOS chip surface 137. The fiber chip coupler 143 enables the physical coupling of the optical fiber cable 145 to the CMOS chip 130.

The light source module 147 may be affixed, via epoxy or solder, for example, to the CMOS chip surface 137. In this manner a high power light source may be integrated with optoelectronic and electronic functionalities of one or more high-speed optoelectronic transceivers on a single CMOS chip.

Figure 2:
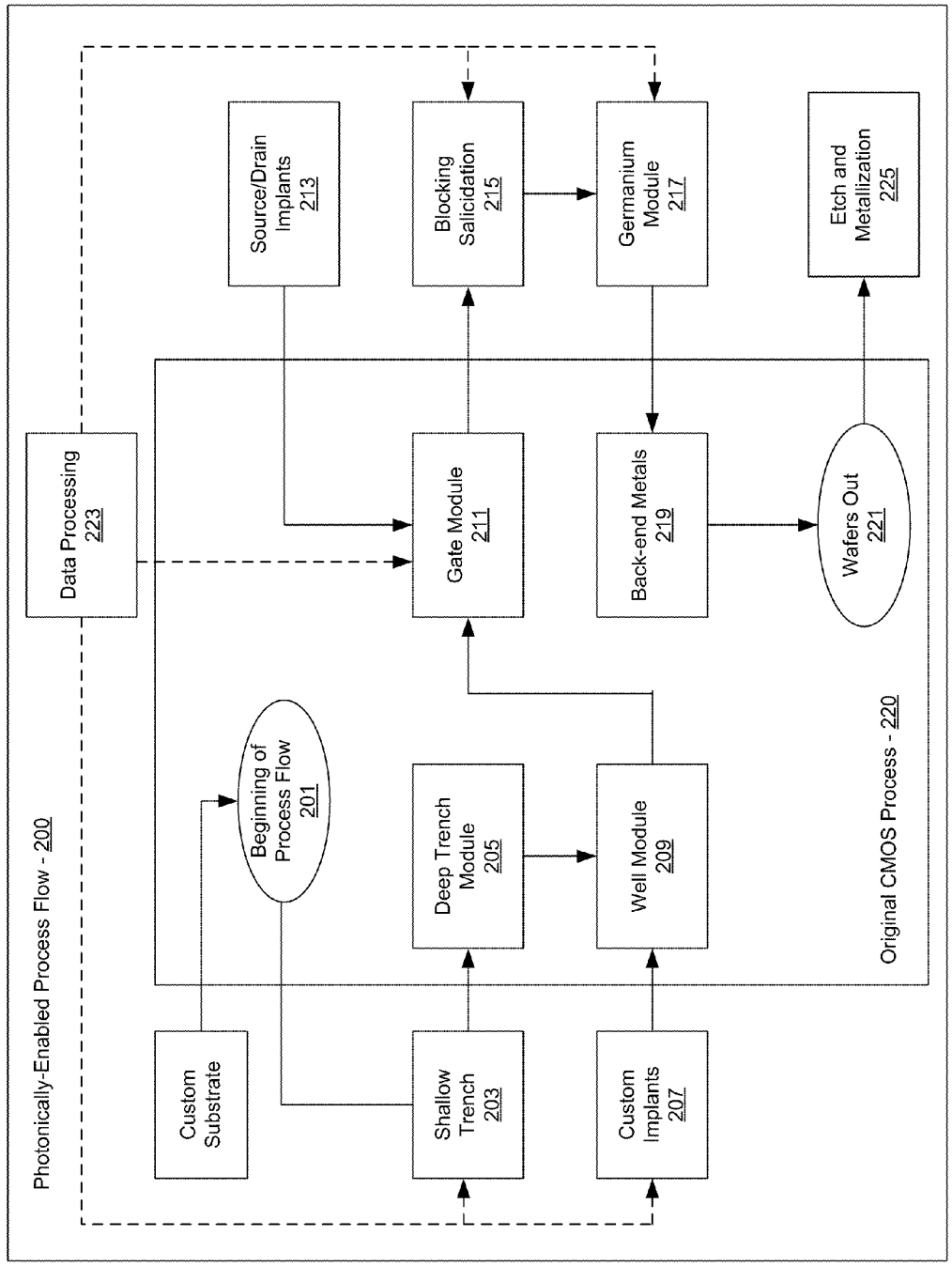
FIG. 2 is a block diagram of an exemplary photonically-enabled process flow with backside etch and metal deposition, in accordance with an embodiment of the invention.

FIG. 2 is a block diagram of an exemplary photonically-enabled process flow with backside etch and metal deposition, in accordance with an embodiment of the invention. Referring to FIG. 2, there is shown a photonically enabled process flow 200 comprising an original CMOS process 220, a shallow trench module 203, a custom implant module 207, source/drain implants module 213, a blocking salicidation module 215, a germanium module 217, and a data processing module 223.

The original CMOS process comprises a beginning of process flow step 201, a deep trench module 205, a well module 209, a gate module 211, a back-end metals module 219, and a wafers out step 221.

The photonically-enabled process flow begins with custom SOI substrates with appropriate oxide thickness for optical processes being inserted into the beginning of process flow step 201 which may comprise suitable wafer preparation processes, such as sorting, cleaning, or quality control, for example. The wafers then proceed to the shallow trench module 203 for defining and etching of shallow trenches. The shallow trench module 203 may comprise photolithography, etching, fill, and chemical-mechanical polishing (CMP), for example, followed by the deep trench module 205, which comprises a conventional CMOS trench module.

The well module 209 comprises photolithography steps and dopant ion implantation to define the wells for CMOS devices. The custom implants module 207 may be inserted into the well module 209, to define doping regions specific to optoelectronic devices, for example. The wafers then proceed to the gate module 211 to define CMOS gates via photolithography, etching, trimming, spacers, and implants, for example. Source and drain implants may be performed by the source/drain implant module 213 before proceeding to the blocking salicidation module 215.

The salicidation module 215 generates a self-aligned silicide layer in the silicon surface for metal contacts, which is followed by the germanium module 217, which may deposit germanium for integrated photodetectors on the SOI silicon wafers. In an embodiment of the invention, the germanium process may be fully CMOS compatible. The wafers then proceed to the back-end metals module 219 which comprises a 6-metal low-k copper process, for example, followed by the wafers out step 221.

In an exemplary embodiment of the invention, the CMOS process flow comprises a 0.13 micron CMOS SOI technology platform for integrating guided-wave optics. The photolithography process comprises deep-UV technology to enable near-IR optics capability, and the high resistivity substrate may enable low microwave loss in the circuitry. Custom steps may be utilized in standard tools, and comprise silicon etch and implant, germanium epitaxy, and may utilize a standard contact module. These processes may be thermal budget compliant, and require no post processing.

In an embodiment of the invention, thick Si-layer SOI substrates may be utilized enabling bulk-like CMOS transistors. This would also enable enhanced optical confinement in optical devices fabricated in the thick Si layer and thus enabling compact photonic devices. In addition, the backside may be etched and a metal reflective layer deposited in the etched trench to improve coupling efficiency of optical devices.

Figure 3A:
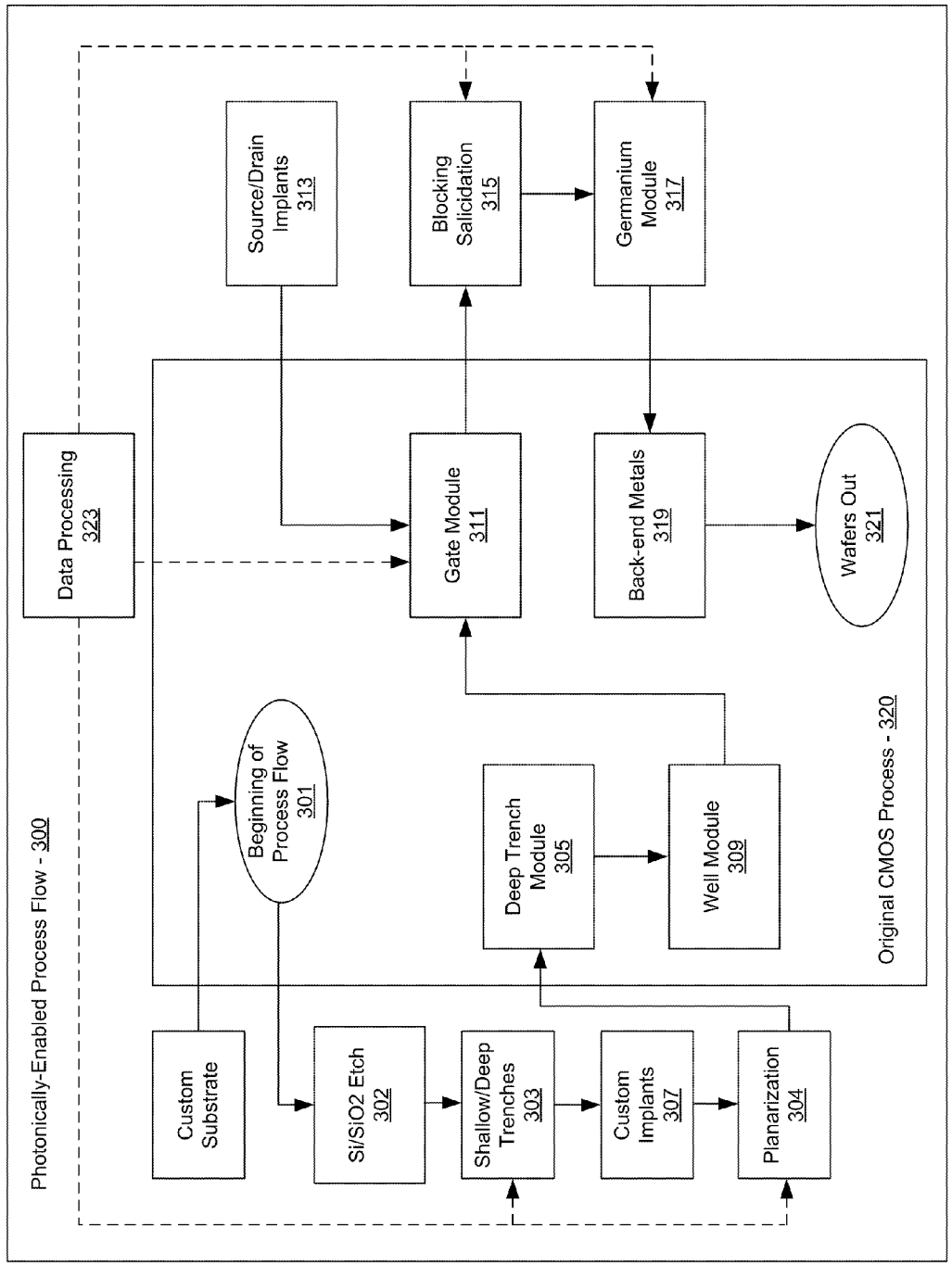
FIG. 3A is a block diagram of an exemplary photonically-enabled process flow with double SOI substrates, in accordance with an embodiment of the invention.

FIG. 3A is a block diagram of an exemplary photonically-enabled process flow with double SOI substrates, in accordance with an embodiment of the invention. Referring to FIG. 3A, there is shown a photonically-enabled process flow 300 comprising an original CMOS process 320, a Si/SiO2 etch module 302, a shallow/deep trench module 303, a planarization module 304, a custom implant module 307, source/drain implants module 313, a blocking salicidation module 315, a germanium module 317, and a data processing module 323.

The original CMOS process comprises a beginning of process flow step 301, a deep trench module 305, a well module 309, a gate module 311, a back-end metals module 319, and a wafers out step 321.

The photonically-enabled process flow begins with custom SOI substrates with appropriate oxide thickness for optical processes being inserted into the beginning of process flow step 301 which may comprise suitable wafer preparation processes, such as sorting, cleaning, or quality control, for example. The wafers then proceed to the Si/SiO$_2$ etch module 302 where the top Si and oxide layers in a double SOI substrate may be removed in areas corresponding to areas where optical devices are to be defined. The shallow/deep trench module 303 and the custom implants module 307 may then be utilized to define the optical devices. The planarization module 304 may be utilized to define a planar surface for the subsequent CMOS module processes such as the deep trench module 305, which comprises a conventional CMOS trench module.

The well module 309 comprises photolithography steps and dopant ion implantation to define the wells for CMOS devices. The custom implants module 307 may be inserted into the well module 309, to define doping regions specific to optoelectronic devices, for example. The wafers then proceed to the gate module 311 to define CMOS gates via photolithography, etching, trimming, spacers, and implants, for example. Source and drain implants may be performed by the source/drain implant module 313 before proceeding to the blocking salicidation module 315.

The salicidation module 315 generates a self-aligned silicide layer in the silicon surface for metal contacts, which is followed by the germanium module 317, which may deposit germanium for integrated photodetectors on the SOI silicon wafers. In an embodiment of the invention, the germanium process may be fully CMOS compatible. The wafers then proceed to the back-end metals module 319 which comprises a 6-metal low-k copper process, for example, followed by the wafers out step 321.

In an exemplary embodiment of the invention, the CMOS process flow comprises a 0.13 micron CMOS SOI technology platform for integrating guided-wave optics. The photolithography process comprises deep-UV technology to enable near-IR optics capability, and the high resistivity substrate may enable low microwave loss in the circuitry. Custom steps may be utilized in standard tools, and comprise silicon etch and implant, germanium epitaxy, and may utilize a standard contact module. These processes may be thermal budget compliant, and require no post processing.

In an embodiment of the invention, two separate SOI layers may be utilized to enable layer thicknesses optimized for both optical and electronic devices, with the desired thicker layer utilized for the photonic devices. In this manner, standard CMOS electronics modules may be utilized without requiring modified processes to account for tradeoffs between electronic and photonic devices.

Figure 3B:
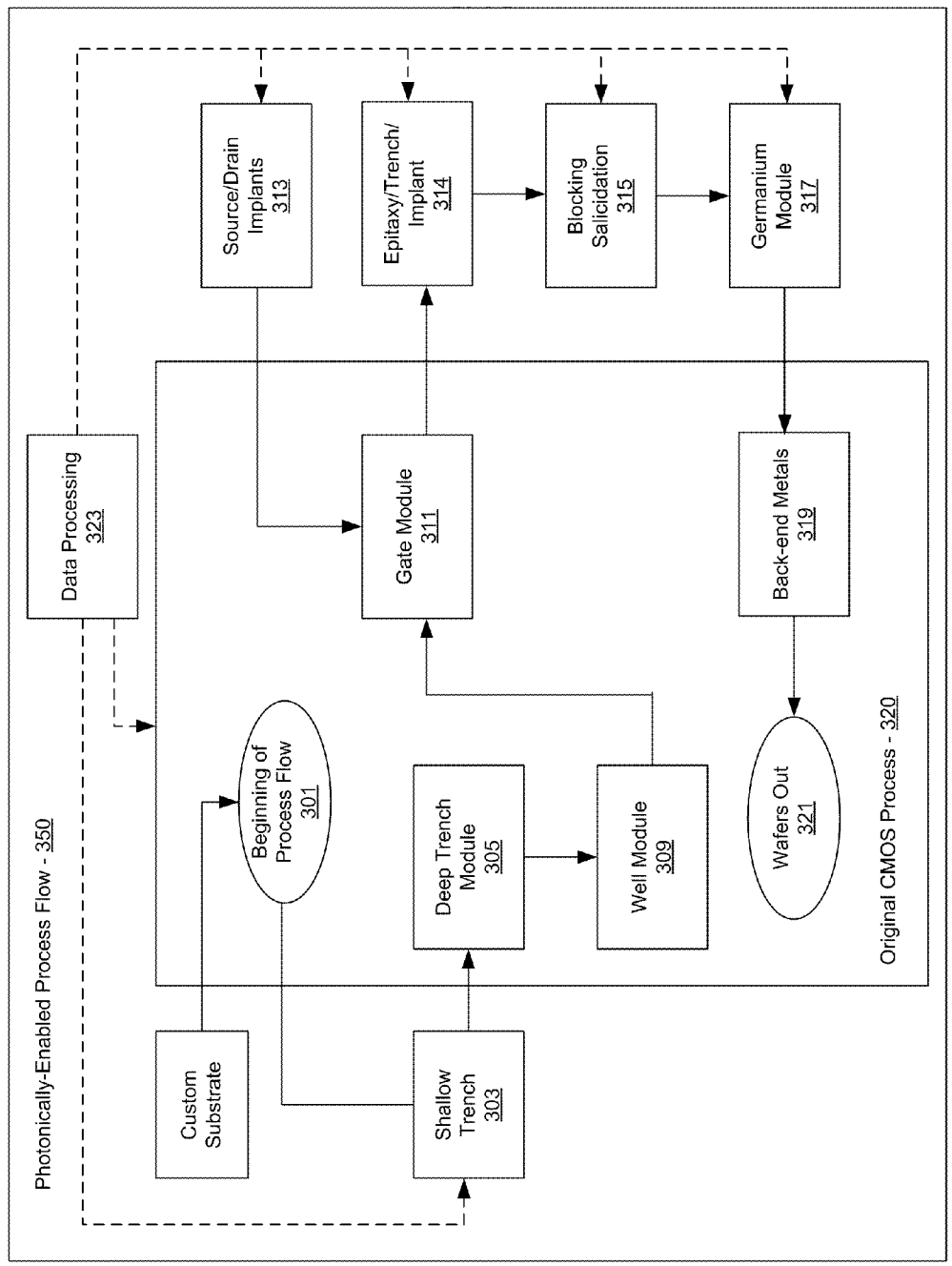
FIG. 3B is a block diagram of an exemplary photonically-enabled process flow with different optical and electronic device layer thicknesses, in accordance with an embodiment of the invention.

FIG. 3B is a block diagram of an exemplary photonically-enabled process flow with different optical and electronic device layer thicknesses, in accordance with an embodiment of the invention. Referring to FIG. 3B, there is shown a photonically-enabled process flow 350 comprising an original CMOS process 320, a shallow/deep trench module 303, source/drain implants module 313, an epitaxy/trench/implant module 314, a blocking salicidation module 315, a germanium module 317, and a data processing module 323.

The original CMOS process comprises a beginning of process flow step 301, a deep trench module 305, a well module 309, a gate module 311, a back-end metals module 319, and a wafers out step 321.

The photonically-enabled process flow begins with custom SOI substrates with appropriate oxide thickness for optical processes being inserted into the beginning of process flow step 301 which may comprise suitable wafer preparation processes, such as sorting, cleaning, or quality control, for example. The wafers then proceed to the shallow trench module 303 for defining and etching of shallow trenches. The shallow trench module 303 may comprise photolithography, etching, fill, and chemical-mechanical polishing (CMP), for example, followed by the deep trench module 305, which comprises a conventional CMOS trench module.

The well module 309 comprises photolithography steps and dopant ion implantation to define the wells for CMOS devices. The wafers then proceed to the gate module 311 to define CMOS gates via photolithography, etching, trimming, spacers, and implants, for example. Source and drain implants may be performed by the source/drain implant module 313 before proceeding to the epitaxy/trench/implant module 314 where a thicker Si layer may be deposited for photonic devices. In addition, further trench and implant steps may be performed for the photonic devices in the epitaxy/trench/implant module 314.

The salicidation module 315 generates a self-aligned silicide layer in the silicon surface for metal contacts, which is followed by the germanium module 317, which may deposit germanium for integrated photodetectors on the SOI silicon wafers. In an embodiment of the invention, the germanium process may be fully CMOS compatible. The wafers then proceed to the back-end metals module 319 which comprises a 6-metal low-k copper process, for example, followed by the wafers out step 321.

In an exemplary embodiment of the invention, the CMOS process flow comprises a 0.13 micron CMOS SOI technology platform for integrating guided-wave optics. The photolithography process comprises deep-UV technology to enable near-IR optics capability, and the high resistivity substrate may enable low microwave loss in the circuitry. Custom steps may be utilized in standard tools, and comprise silicon etch and implant, germanium epitaxy, and may utilize a standard contact module. These processes may be thermal budget compliant, and require no post processing.

In an embodiment of the invention, two separate Si layer thicknesses may be utilized to enable layer thicknesses optimized for both optical and electronic devices, with the desired thicker layer utilized for the photonic devices deposited in the epitaxy/trench/implant module 314. In this manner, standard CMOS electronics modules may be utilized without requiring modified processes to account for tradeoffs between electronic and photonic devices.

Figure 3C:
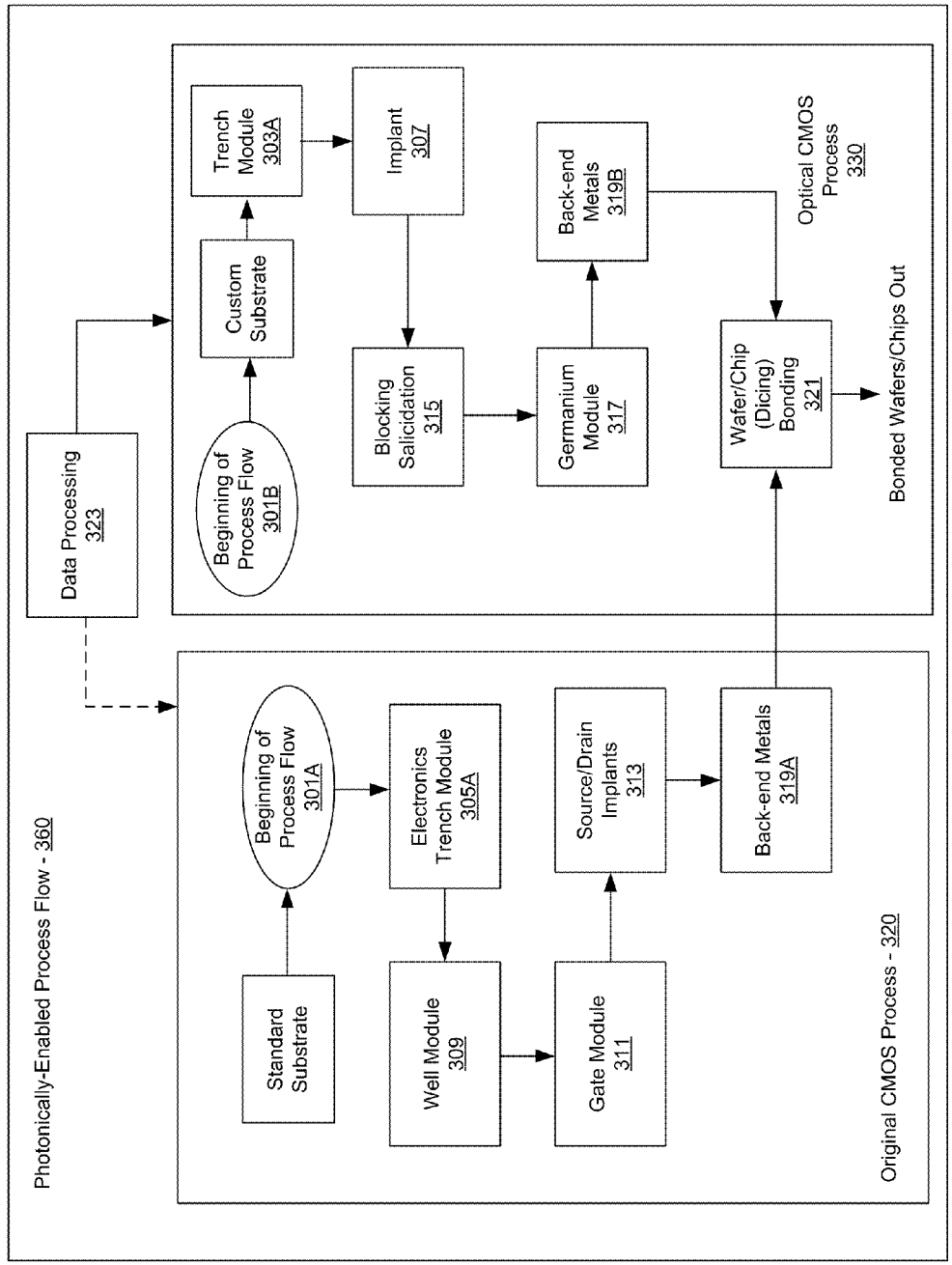
FIG. 3C is a block diagram of an exemplary photonically-enabled process flow with wafer/chip bonding, in accordance with an embodiment of the invention.

FIG. 3C is a block diagram of an exemplary photonically-enabled process flow with wafer/chip bonding, in accordance with an embodiment of the invention. Referring to FIG. 3C, there is shown a photonically-enabled process flow 360 comprising an original CMOS process 320, an optical CMOS process 330, and a data processing module 323. The original CMOS process 320 may comprise a trench module 305A, a well module 309, a gate module 311, a source/drain implant module 313, and a back-end metals module 319A.

The optical CMOS process process 330 may comprise a trench module 303A, an implant module 307, a blocking salicidation module 315, a germanium module 317, a back-end metals module 319B, and a wafer/chip bonding module 321.

The original CMOS process flow 330 begins with standard SOI substrates being inserted into the beginning of process flow step 301A which may comprise suitable wafer preparation processes, such as sorting, cleaning, or quality control, for example. The wafers then proceed to the trench module 305A for defining and etching of shallow and/or deep trenches. The trench module 305A may comprise photolithography, etching, fill, and chemical-mechanical polishing (CMP), for example, before proceeding to the well module 309.

The well module 309 comprises photolithography steps and dopant ion implantation to define the wells for CMOS devices. The wafers then proceed to the gate module 311 to define CMOS gates via photolithography, etching, trimming, spacers, and implants, for example. Source and drain implants may be performed by the source/drain implant module 313 before proceeding to the back-end metals module 319A.

The optical CMOS process flow 330 begins with custom SOI substrates with appropriate oxide thickness for optical processes being inserted into the beginning of process flow step 301 which may comprise suitable wafer preparation processes, such as sorting, cleaning, or quality control, for example. The wafers then proceed to the trench module 303A which may comprise photolithography, etching, fill, and chemical-mechanical polishing (CMP), for example, followed by the implant module 307 where dopants appropriate for optical devices may be implanted into the optical wafers.

The salicidation module 315 generates a self-aligned silicide layer in the silicon surface for metal contacts, which is followed by the germanium module 317, which may deposit germanium for integrated photodetectors on the SOI silicon wafers. In an embodiment of the invention, the germanium process may be fully CMOS compatible. The wafers then proceed to the back-end metals module 319 which comprises a 6-metal low-k copper process, for example, followed by the wafers out step 321.

The wafers from the optical CMOS process 330 may then be bonded to the wafers from the original CMOS process 320 in the wafer/chip bonding module 321. In another exemplary embodiment of the invention, bonding may be utilized to bond chips as opposed to full wafers. In this instance, a dicing process would be utilized in the wafer/chip bonding module 321 to generate chips for bonding.

In an exemplary embodiment of the invention, the CMOS process flow 320 comprises a 0.13 micron CMOS SOI technology platform for integrating guided-wave optics. The photolithography process comprises deep-UV technology to enable near-IR optics capability, and the high resistivity substrate may enable low microwave loss in the circuitry. Custom steps may be utilized in standard tools, and comprise silicon etch and implant, germanium epitaxy, and may utilize a standard contact module. These processes may be thermal budget compliant, and require no post processing.

In an embodiment of the invention, two separate CMOS wafer processes may be utilized to enable wafers optimized for both optical and electronic devices. The wafers, or chips, may then be bonded to result in a hybrid structure with increased device performance for both electronic and photonic devices. In this manner, standard CMOS electronics modules may be utilized without requiring modified processes to account for tradeoffs between electronic and photonic devices.

Figure 4A:
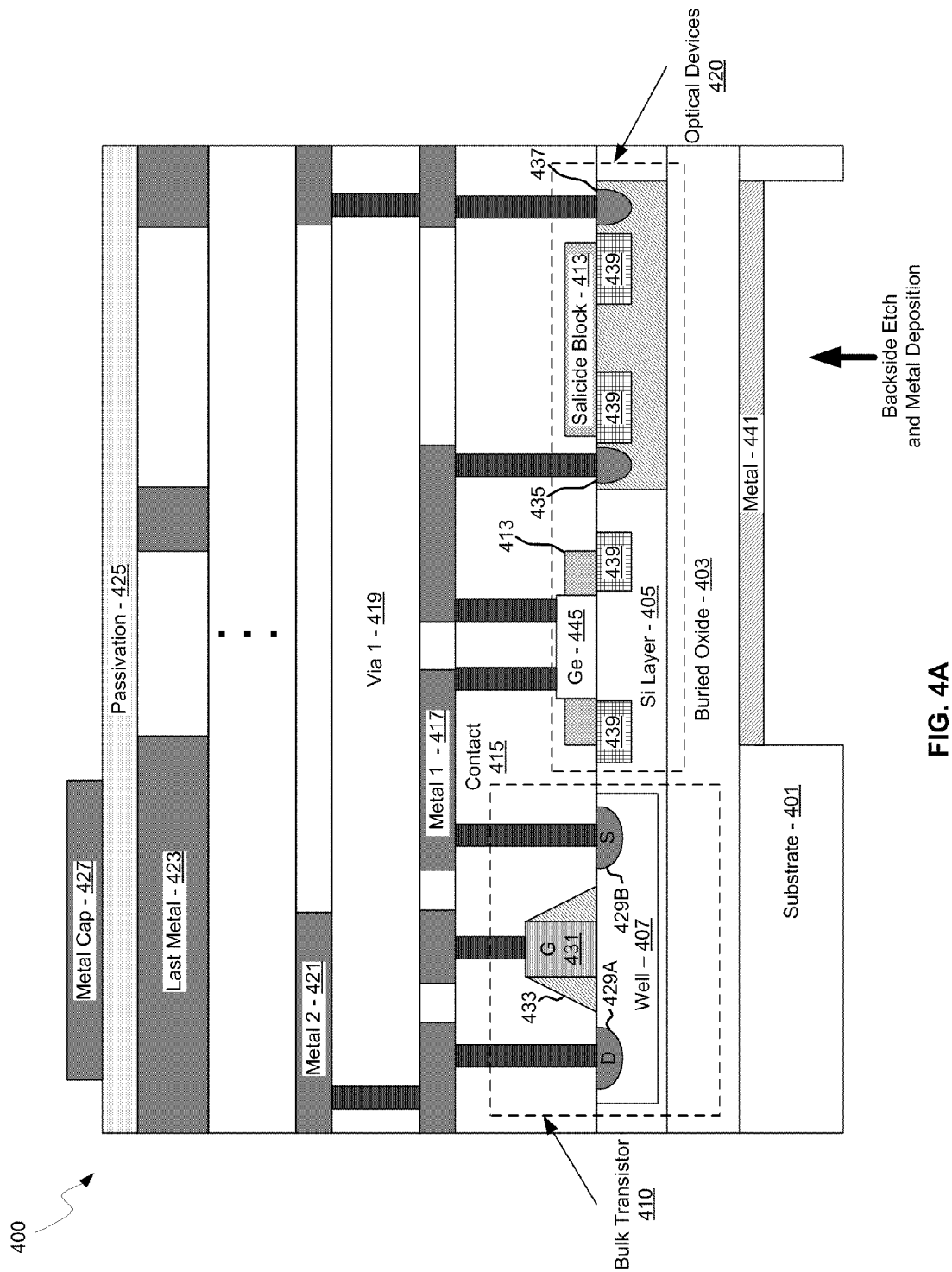
FIG. 4A is a cross-section of exemplary integrated electrical and optoelectronic devices, in accordance with an embodiment of the invention.

FIG. 4A is a cross-section of exemplary integrated electrical and optoelectronic devices, in accordance with an embodiment of the invention. Referring to FIG. 4A, there is shown an integrated semiconductor structure 400 comprising a transistor 410 and optical devices 420 and associated layers. The integrated semiconductor structure 400 may result from the process flow described with respect to FIG. 2. The layers are utilized to fabricate the transistor 410 and the optical devices 420, to isolate, and to provide electrical connection to the devices, for example.

The integrated semiconductor structure 400 comprises a silicon substrate 401, a buried oxide 403, a silicon layer 405, a contact layer 415, a metal 1 layer 417, a via 1 layer 419, a metal 2 layer 421, a last metal layer 423, a passivation layer 425, a metal cap 427, a metal layer 441, and a Ge-layer 445. The metal 1 layer 417, the metal 2 layer 421, the last metal layer, and the metal cap 427 provide electrical contact between layers and to electrical and optoelectronics devices, such as the transistor 410 and the optical devices 420. The metal layer 441 enables improved efficiencies of optical I/O devices, such as the optical devices 420, for example. The via 1 layer 419 and the contact layer 415 also enable electrical contact to the devices while providing electrical isolation between devices by incorporating insulating materials between conductive vias.

The transistor 410 comprises the well 407, drain and source implant layers 429A and 429B, respectively, a gate 431, and a passivation layer 433. In an embodiment of the invention, the Si-layer 405 may be thick enough that the transistor 410 may be considered a bulk transistor. If the silicon layer thickness is made thick enough, the substrate will look and act like a bulk substrate from the point of the view of the transistors and process, especially at more advanced CMOS nodes where critical dimensions get smaller and smaller, including implant and junction depths, so that there is an optimal thickness at which bulk CMOS compatibility and optimal optical performance may be achieved.

The well region 407 is a doped silicon layer that enables complementary devices to be integrated on the same substrate by creating a layer of opposite doping to that of the region outside the well. In this manner, in instances where the well is n-doped, the source and drain implant layers 429A and 429B may comprise p-doped silicon, for example.

The gate 431 may comprise metal or polysilicon, for example, that may be isolated from the well 407 by a thin oxide layer (not shown).

The optical devices 420 comprise doped and undoped regions of the Si-layer 405, a salicide block 413, doped contact regions 435 and 437, etched regions 439, and the Ge-layer 445. The salicide block 413 comprises a layer of material to prevent the silicon of the optical devices 420 and other optical devices from being salicided during the standard CMOS process. If silicon in the optical devices was salicided, large optical losses would result. Additionally, the salicide block 413 blocks unwanted implants into the waveguides and other optical devices, which would also cause unwanted loss. The salicide block 413 may be etched to the Si-layer 405 so that the Ge-layer 445 may be deposited. The Ge-layer 445 may be utilized in a photodetector device, for example. In addition, etched regions 439 in the Si-layer 405 may be utilized for optical confinement. The etch regions 439 may be refilled with a low-k dielectric, for example, or may comprise an air gap with no refill material. Fill material may comprise silicon oxide or oxynitride materials, for example.

The substrate 401 may be backside etched and the metal layer 441 deposited in the etched region to provide a reflective surface for optical devices such as the optical devices 420, for example.

Figure 4B:
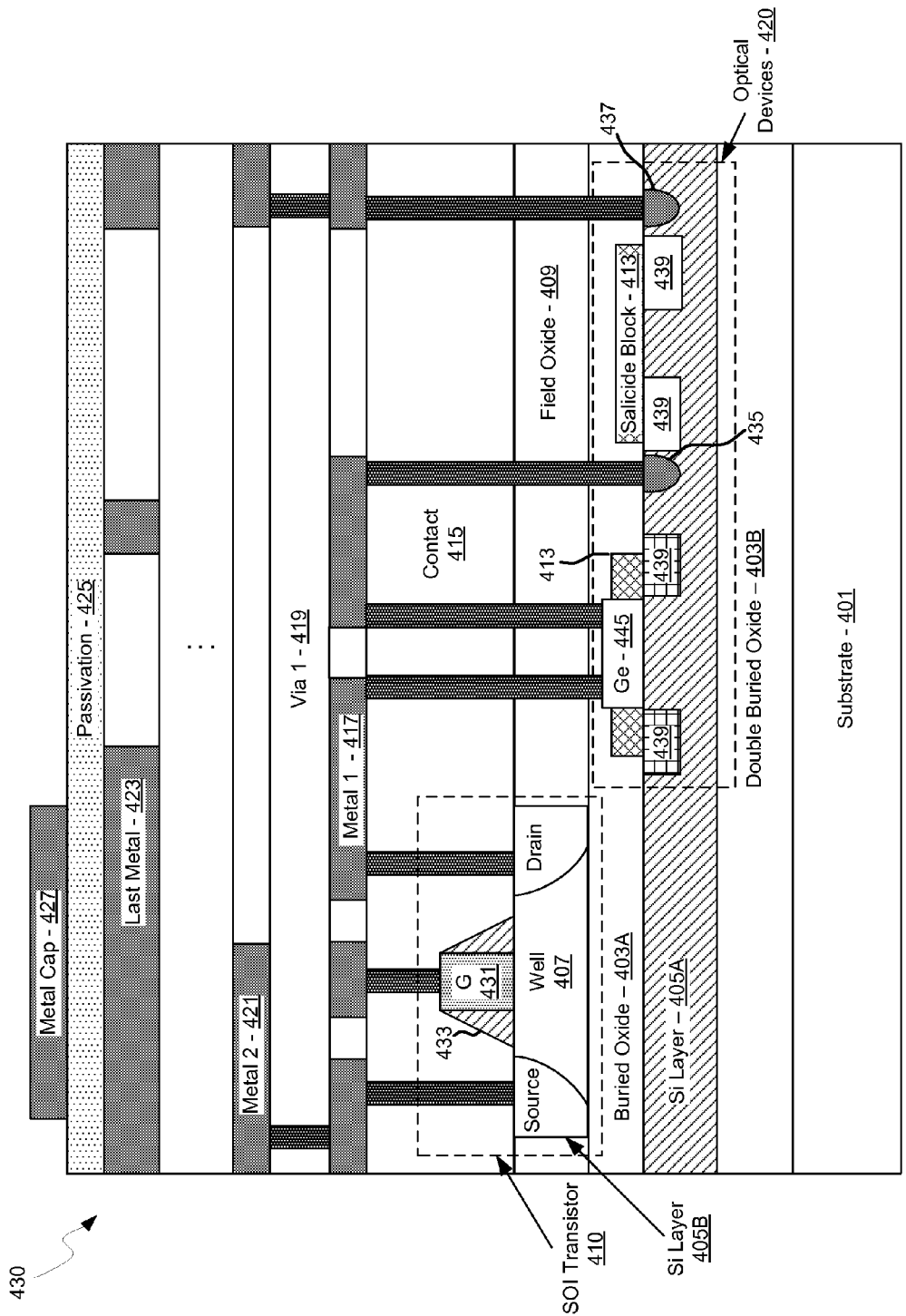
FIG. 4B is a cross-section of exemplary integrated electrical and optoelectronic devices fabricated using a double SOI process, in accordance with an embodiment of the invention.

FIG. 4B is a cross-section of exemplary integrated electrical and optoelectronic devices fabricated using a double SOI process, in accordance with an embodiment of the invention. Referring to FIG. 4B, there is shown an integrated semiconductor structure 430 comprising a transistor 410 and optical devices 420 and associated layers. The integrated semiconductor structure 430 may result from the process flow described with respect to FIG. 3A. The layers are utilized to fabricate the transistor 410 and the optical devices 420, to isolate, and to provide electrical connection to the devices, for example.

The integrated semiconductor structure 430 comprises a silicon substrate 401, a buried oxide layer 403A, a double buried oxide layer 403B, silicon layers 405A and 405B, field oxide 409, a contact layer 415, a metal 1 layer 417, a via 1 layer 419, a metal 2 layer 421, a last metal layer 423, a passivation layer 425, a metal cap 427, and Ge-layer 445. The metal 1 layer 417, the metal 2 layer 421, the last metal layer, and the metal cap 427 provide electrical contact between layers and to electrical and optoelectronics devices, such as the transistor 410 and the optical devices 420. The via 1 layer 419 and the contact layer 415 also enable electrical contact to the devices while providing electrical isolation between devices by incorporating insulating materials between conductive vias.

The transistor 410 comprises a SOI transistor with source and drain regions formed in the Si-layer comprising the well 407 from dopant implant processes, for example, a gate 431, and a passivation layer 433. The gate 431 may comprise metal or polysilicon, for example, that may be isolated from the well 407 by a thin oxide layer (not shown).

The optical devices 420 comprise doped and/or undoped regions of the Si-layer 405A, a salicide block 413, doped contact regions 435 and 437, etched regions 439, and the Ge-layer 445. The salicide block 413 comprises a layer of material to prevent the silicon of the optical devices 420 and other optical devices from being salicided during the standard CMOS process. If silicon in the optical devices was salicided, large optical losses would result. Additionally, the salicide block 413 blocks unwanted implants into the waveguides and other optical devices, which would also cause unwanted loss. The salicide block 413 may be etched to the Si-layer 405A where the Ge-layer 445 may be deposited. The Ge-layer 445 may be utilized in a photodetector device, for example. In addition, etched regions 439 in the Si-layer 405A may be utilized for optical confinement. The etch regions 439 may be refilled with a low-k dielectric, for example, or may comprise an air gap with no refill material. Fill material may comprise silicon oxide or oxynitride materials, for example.

In an embodiment of the invention, a double-SOI substrate with two Si-layer thicknesses may be utilized to provide appropriate layer thicknesses for both optical and electronic devices in the CMOS process. Accordingly, a thicker Si-layer 405A for improved optical devices may be introduced beneath the thinner Si-layer 405B for standard CMOS electronic device processes. In this exemplary embodiment, the electronic devices are on top of the optical devices such that the optical device processes do not affect the electronic device performance. In addition, the optical device processes may be designed taking into account the subsequent electronic device processes to take place.

In another embodiment of the invention, the optical devices may be fabricated on top of the electronic devices, but this may alter the performance of the standard CMOS electronic devices.

Figure 4C:
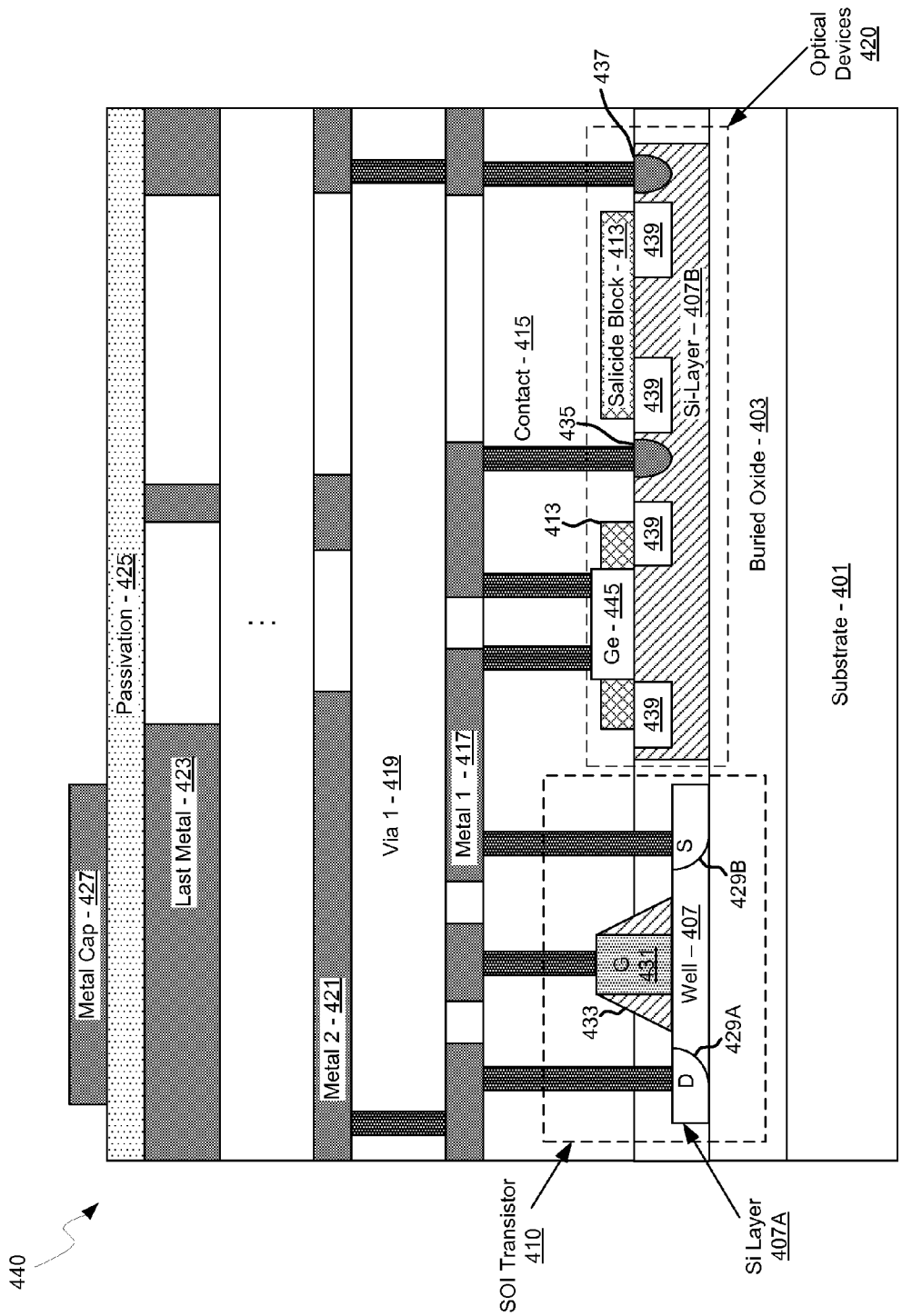
FIG. 4C is a cross-section of exemplary integrated electrical and optoelectronic devices fabricated using two silicon layer thicknesses, in accordance with an embodiment of the invention.

FIG. 4C is a cross-section of exemplary integrated electrical and optoelectronic devices fabricated using two silicon layer thicknesses, in accordance with an embodiment of the invention. Referring to FIG. 4C, there is shown an integrated semiconductor structure 440 comprising a transistor 410 and optical devices 420 and associated layers. The integrated semiconductor structure 440 may result from the process flow described with respect to FIG. 3B. The layers are utilized to fabricate the transistor 410 and the optical devices 420, to isolate, and to provide electrical connection to the devices, for example.

The integrated semiconductor structure 440 comprises a silicon substrate 401, a buried oxide layer 403, a well 407, a silicon layer 407B, a contact layer 415, a metal 1 layer 417, a via 1 layer 419, a metal 2 layer 421, a last metal layer 423, a passivation layer 425, and a metal cap 427. The metal 1 layer 417, the metal 2 layer 421, the last metal layer, and the metal cap 427 provide electrical contact between layers and to electrical and optoelectronics devices, such as the transistor 410 and the optical devices 420. The via 1 layer 419 and the contact layer 415 also enable electrical contact to the devices while providing electrical isolation between devices by incorporating insulating materials between conductive vias.

The transistor 410 comprises a SOI transistor with source and drain regions formed in the well 407 from dopant implant processes, for example, a gate 431, and a passivation layer 433. The gate 431 may comprise metal or polysilicon, for example, that may be isolated from the well 407 by a thin oxide layer (not shown).

The optical devices 420 comprises doped and/or undoped regions of the Si-layer 407B, a salicide block 413, doped contact regions 435 and 437, etched regions 439, and the Ge-layer 445. The salicide block 413 comprises a layer of material to prevent the silicon of the optical devices 420 and other optical devices from being salicided during the standard CMOS process. If silicon in the optical devices was salicided, large optical losses would result. Additionally, the salicide block 413 blocks unwanted implants into the waveguides and other optical devices, which would also cause unwanted loss. The salicide block 413 may be etched to the Si-layer 407B where the Ge-layer 445 may be deposited. The Ge-layer 445 may be utilized in a photodetector device, for example. In addition, etched regions 439 in the Si-layer 405 may be utilized for optical confinement. The etch regions 439 may be refilled with a low-k dielectric, for example, or may comprise an air gap with no refill material. Fill material may comprise silicon oxide or oxynitride materials, for example.

In an embodiment of the invention, silicon layers of different thickness may be deposited in the same deposition process, such as by selective area growth, for example. In this manner, Si-layer thicknesses may be configured for the particular device. For example, the Si-layer 407B in the optical devices 420 may be thicker than the Si-layer 407A in the transistor 410 since optical devices may require thicker layers for better optical confinement, while resulting in Si-layer thicknesses used in standard CMOS electronics processes. In another embodiment of the invention, a thick Si-layer may be grown, and regions corresponding to electronic devices may be thinned.

Figure 4D:
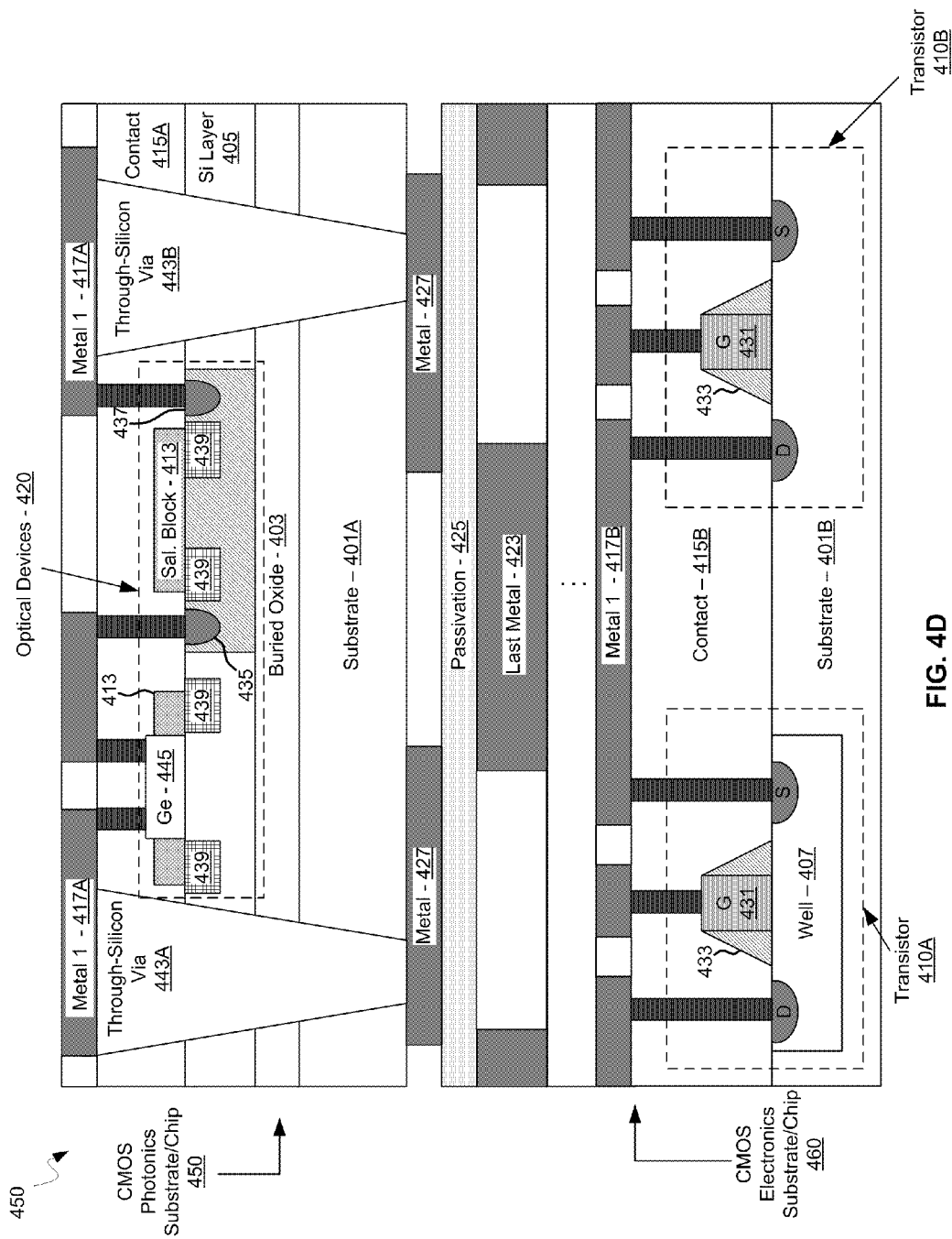
FIG. 4D is a cross-section of exemplary integrated electrical and optoelectronic devices fabricated using wafer/chip bonding, in accordance with an embodiment of the invention.

FIG. 4D is a cross-section of exemplary integrated electrical and optoelectronic devices fabricated using wafer/chip bonding, in accordance with an embodiment of the invention. Referring to FIG. 4D, there is shown an integrated semiconductor structure 450 comprising a CMOS photonics substrate/chip 450, a CMOS electronics substrate/chip 460, and the metal cap layer 427 for substrate/chip physical and electrical coupling. The CMOS photonics substrate/chip 450 comprises optical devices 420 and associated layers, and the CMOS electronics substrate/chip 460 comprises transistors 410A and 410B and associated layers. The integrated semiconductor structure 440 may result from the process flow described with respect to FIG. 3C. The layers are utilized to fabricate the transistors 410A and 410B and the optical devices 420, to isolate, and to provide electrical connection to the devices, for example.

The CMOS photonics substrate/chip 450 comprises a substrate 401A, a buried oxide 403, a Si-layer 405, a contact layer 415A, a metal 1 layer 417A, and through-silicon vias (TSVs) 443A and 443B. The optical devices 420 comprise doped and/or undoped regions of the Si-layer 405, a salicide block 413, doped contact regions 435 and 437, etched region 439, and the Ge-layer 445. The salicide block 413 comprises a layer of material to prevent the silicon of the optical devices 420 and other optical devices from being salicided during the standard CMOS process. If silicon in the optical devices was sailcided, large optical losses would result. Additionally, the salicide block 413 blocks unwanted implants into the waveguides and other optical devices, which would also cause unwanted loss. The salicide block 413 may be etched to the Si-layer 405 so that the Ge-layer 445 may be deposited. The Ge-layer 445 may be utilized in a photodetector device, for example. In addition, etched regions 439 in the Si-layer 405 may be utilized for optical confinement. The etch regions 439 may be refilled with a low-k dielectric, for example, or may comprise an air gap with no refill material. Fill material may comprise silicon oxide or oxynitride materials, for example.

The CMOS electronics substrate/chip 460 comprises a silicon substrate 401B, a well 407, a contact layer 415B, a metal 1 layer 417B, a last metal layer 423, a passivation layer 425, and the metal cap 427. The metal 1 layer 417B, the last metal layer 423, and the metal cap 427 provide electrical contact between layers and to electrical and optoelectronics devices, such as the transistors 410A and 410B and the optical devices 420. The contact layer 415 also enables electrical contact to the devices while providing electrical isolation between devices by incorporating insulating materials between conductive vias.

The transistors 410A and 410B comprise bulk transistors with source and drain regions formed in the well 407 or the substrate 401B, respectively, from dopant implant processes, for example, as well as a gate 431, and a passivation layer 433. The gate 431 may comprise metal or polysilicon, for example, that may be isolated from the well 407 by a thin oxide layer (not shown).

In an embodiment of the invention, separate CMOS processes may be utilized to fabricate the CMOS photonics substrate/chip 450 and the CMOS electronics substrate/chip 460 so that the processes may be optimized for each type of device. The wafers, or alternatively diced chips, may then be bonded together to form an optoelectronic hybrid module. In this manner, layer thicknesses and doping levels may be configured for the best electronic and photonic performance in the respective structure without the tradeoffs in performance associated with fabricating electronic and photonic structures concurrently.

Figure 5:
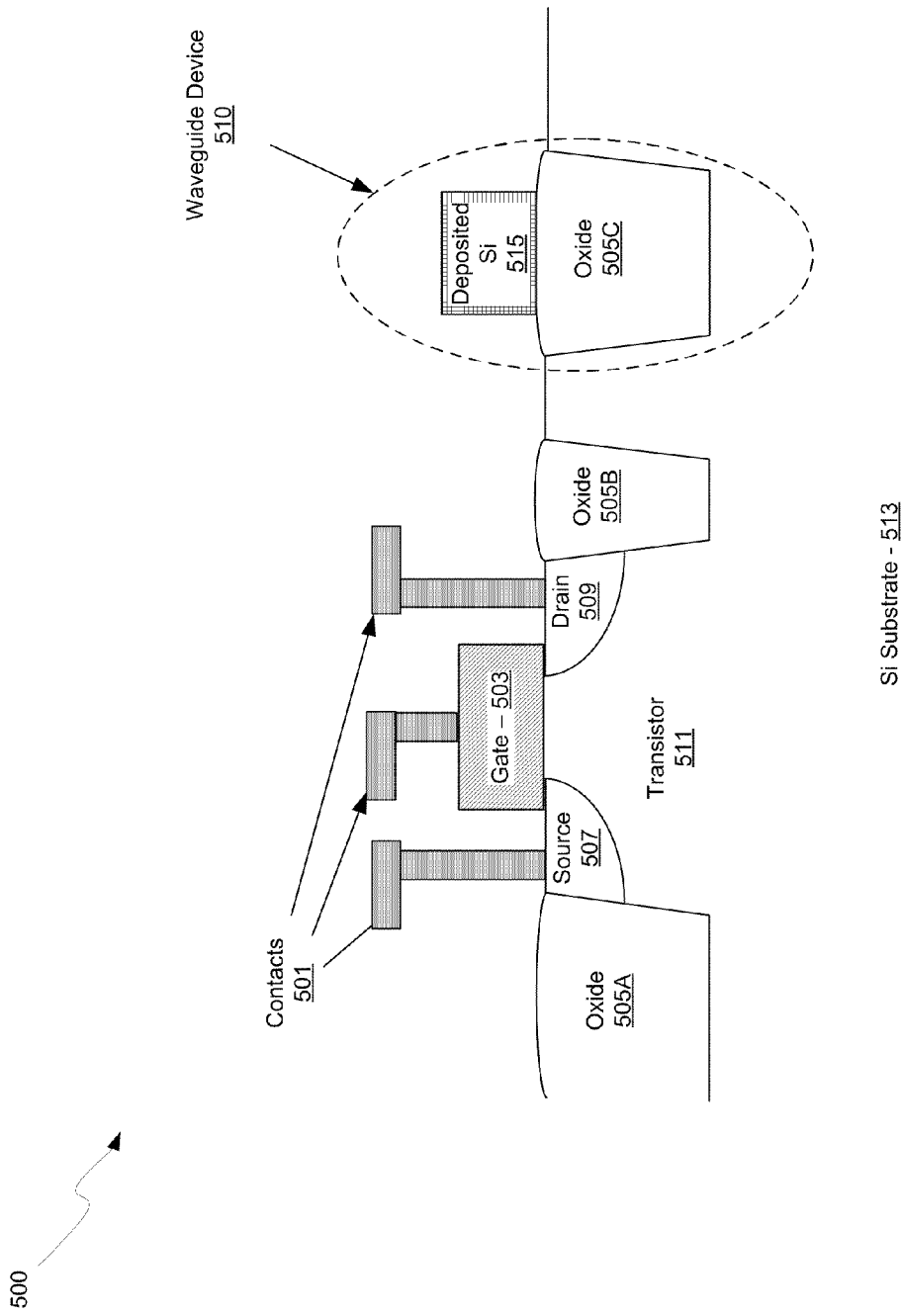
FIG. 5 is a diagram illustrating an exemplary structure utilizing a shallow trench as a bottom cladding, in accordance with an embodiment of the invention.

FIG. 5 is a diagram illustrating an exemplary structure utilizing a shallow trench as a bottom cladding, in accordance with an embodiment of the invention. Referring to FIG. 5, there is shown integrated electronic and photonic structure 500 comprising a transistor 511 and a waveguide device 510 integrated in the Si substrate 513.

The transistor 511 comprises contacts 501, a gate 503, oxide layers 505A and 505B, source 507 and drain 509. The contacts 501 comprise metal and/or other conductive material for electrical contact to the transistor 511. The source 507 and drain 509 may be formed via implantation of dopant material into a silicon layer in the substrate 513, for example. The waveguide device comprises deposited Si 515 and oxide layer 505C.

Electronics processes typically use a shallow trench into the silicon refilled with silicon dioxide or another low index dielectric to provide electrical isolation between transistors. An alternative process could utilize a local formation of oxide (LOCOS) process to create electrical isolation, with the same result—an area of the starting silicon wafer is replaced with silicon dioxide or another dielectric. This area can be used as the bottom cladding for a waveguide or other photonic structure. Although this structure is referred to as a field oxide here, materials other than oxide may be utilized.

In an embodiment of the invention, silicon or another material of higher index, such as silicon nitride or silicon oxynitride, may be deposited and patterned over the field oxide, resulting in the deposited Si 515. If silicon is deposited, it typically will not result in crystalline silicon, but either polysilicon or amorphous silicon. Subsequent processes may improve the quality of the silicon, such as thermal annealing or laser treatment. If silicon nitride is used, it is generally used to fabricate passive optical devices like waveguides and couplers, but not active devices like modulators. In an embodiment of the invention, photodetection may be provided by growing a Ge photodetector directly on silicon and butt-coupling a silicon or silicon nitride waveguide directly into the Ge area.

Figure 6:
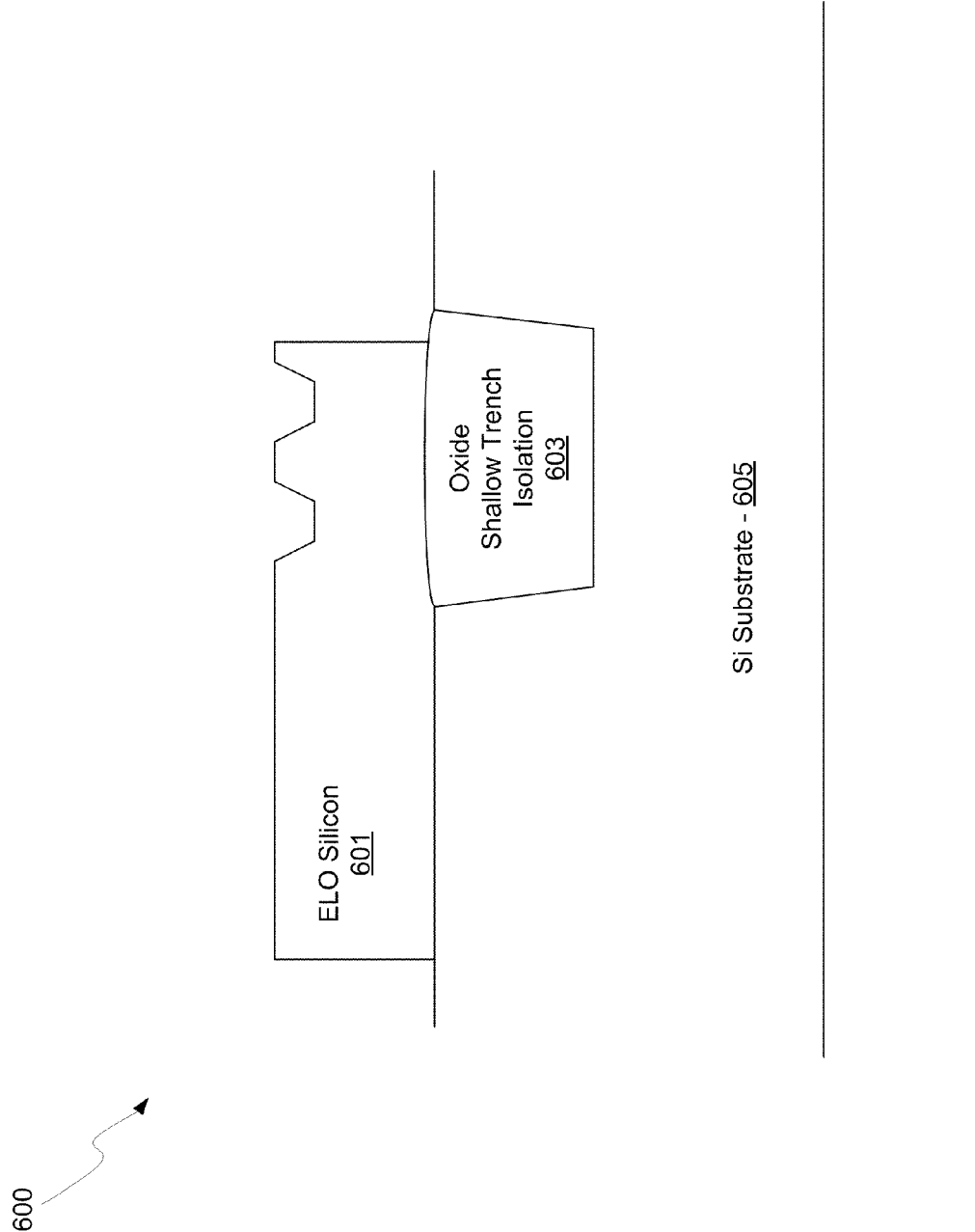
FIG. 6 is a diagram illustrating an exemplary epitaxial lateral overgrowth optical device, in accordance with an embodiment of the invention.

FIG. 6 is a diagram illustrating an exemplary epitaxial lateral overgrowth optical device, in accordance with an embodiment of the invention. Referring to FIG. 6, there is shown a rib waveguide 600 comprising an epitaxial lateral overgrowth (ELO) Si layer 601, a shallow trench isolation oxide 603, and a Si substrate 605.

In an embodiment of the invention, silicon material may be deposited utilizing lateral epitaxial overgrowth (ELO) to form a photonic device in a small area over the field oxide, namely the shallow trench isolation oxide 603. The ELO Si layer 601 may be patterned to form a rib waveguide that may be nearly equivalent to a crystalline silicon waveguide in the substrate. In this manner, most silicon based optical devices may be fabricated.

Figure 7:
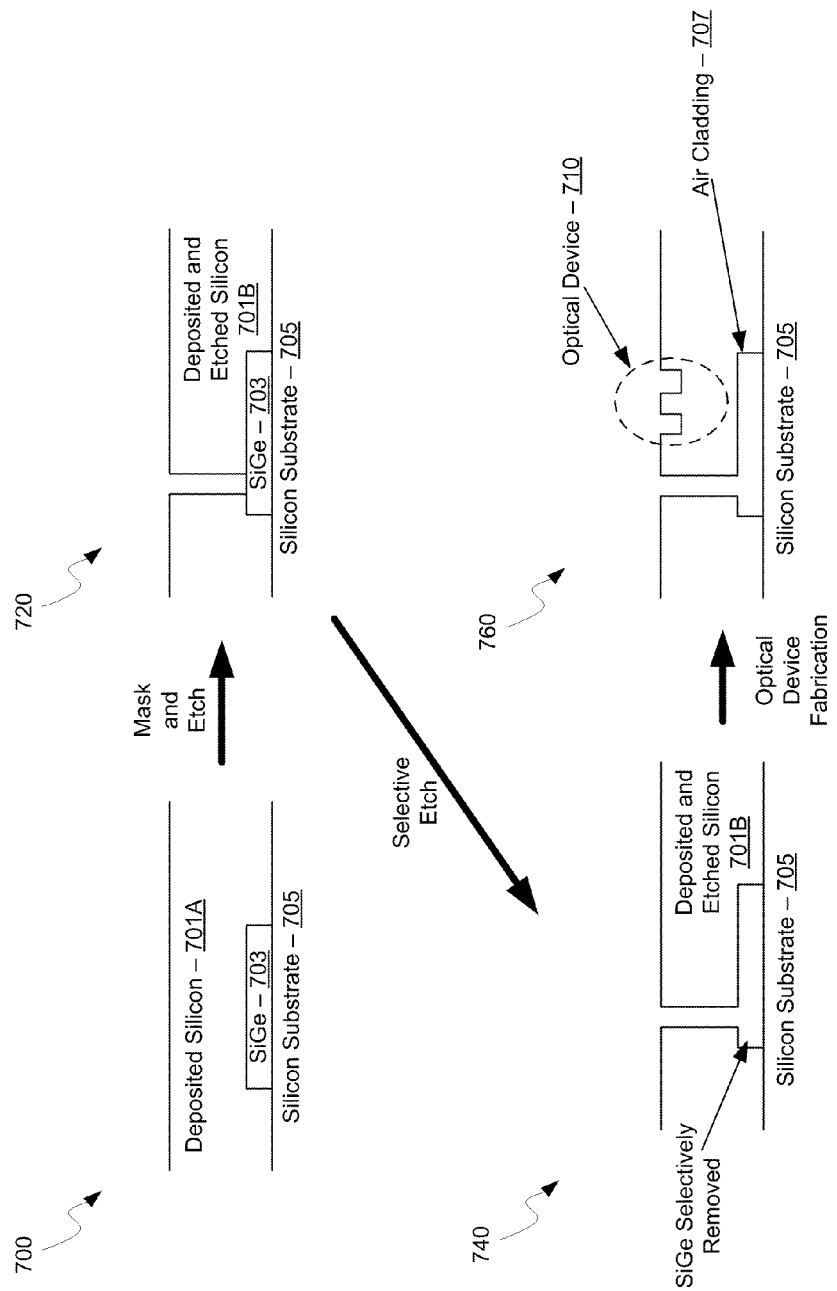
FIG. 7 is a diagram illustrating exemplary cladding formation by removal of silicon, in accordance with an embodiment of the invention.

FIG. 7 is a diagram illustrating exemplary cladding formation by removal of silicon, in accordance with an embodiment of the invention. Referring to FIG. 7, there is shown a deposited Si layer 701A, a SiGe layer 703, and Si substrate 705 processed through the steps 700, 720, 740, and 760.

In step 700, there is shown the Si substrate 705 with the deposited Si layer 701A over the SiGe layer 703. SiGe may be selectively etched when the Ge content is at least a few percent over Si. The SiGe layer 703 is deposited locally over the Si substrate 705 in the areas where the photonic devices are desired. Silicon may then be grown over the entire wafer, or only locally, encompassing the areas where SiGe has been deposited.

In step 720, the deposited Si 701A may be etched locally down to the SiGe layer 703, followed by step 740 where a selective SiGe etch may be utilized to remove the SiGe area. This effectively leaves a layer of silicon standing over an air cavity, the air cladding 707 shown in step 760, where the optical device 710 may be fabricated. The air cladding 707 provides the index contrast needed to form a waveguide. The remaining silicon can be processed to form waveguides and other optical devices.

Figure 8:
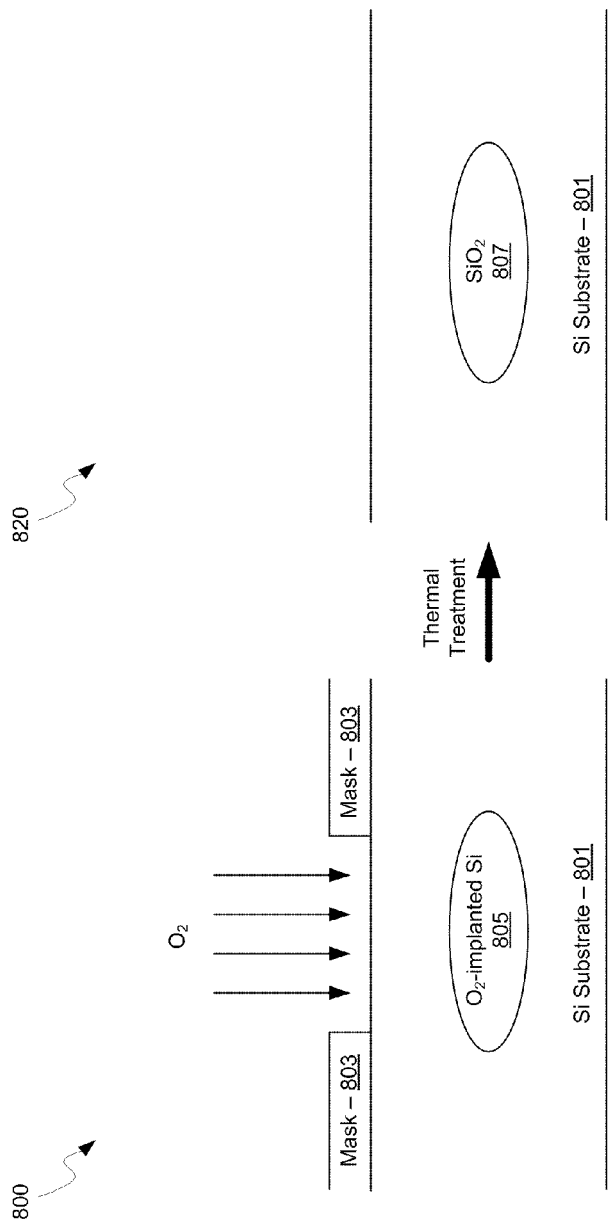
FIG. 8 is a diagram illustrating exemplary oxide formation through oxygen implant and thermal treatment, in accordance with an embodiment of the invention.

FIG. 8 is a diagram illustrating exemplary oxide formation through oxygen implant and thermal treatment, in accordance with an embodiment of the invention. Referring to FIG. 8, there is shown $SiO_2$ formation process comprising steps 800 and 802 which comprise a Si substrate 801, a mask 803, an $O_2$-implanted Si layer 805, and an $SiO_2$ layer 807. In an embodiment of the invention $O_2$ may be implanted in the Si substrate 801 through openings in the mask 803, thereby forming the $O_2$-implanted Si layer 805, as shown in step 800.

A thermal treatment of the $O_2$-implanted Si layer 805 generates the $SiO_2$ layer 807 shown in step 820. Accordingly, this process may be utilized to form optical cladding layers at an appropriate distance below the Si surface, thereby enabling optical confinement. In addition, $SiO_2$ layer 807 also provides etch selectivity to silicon and may be used to form other optical devices.

Figure 9:
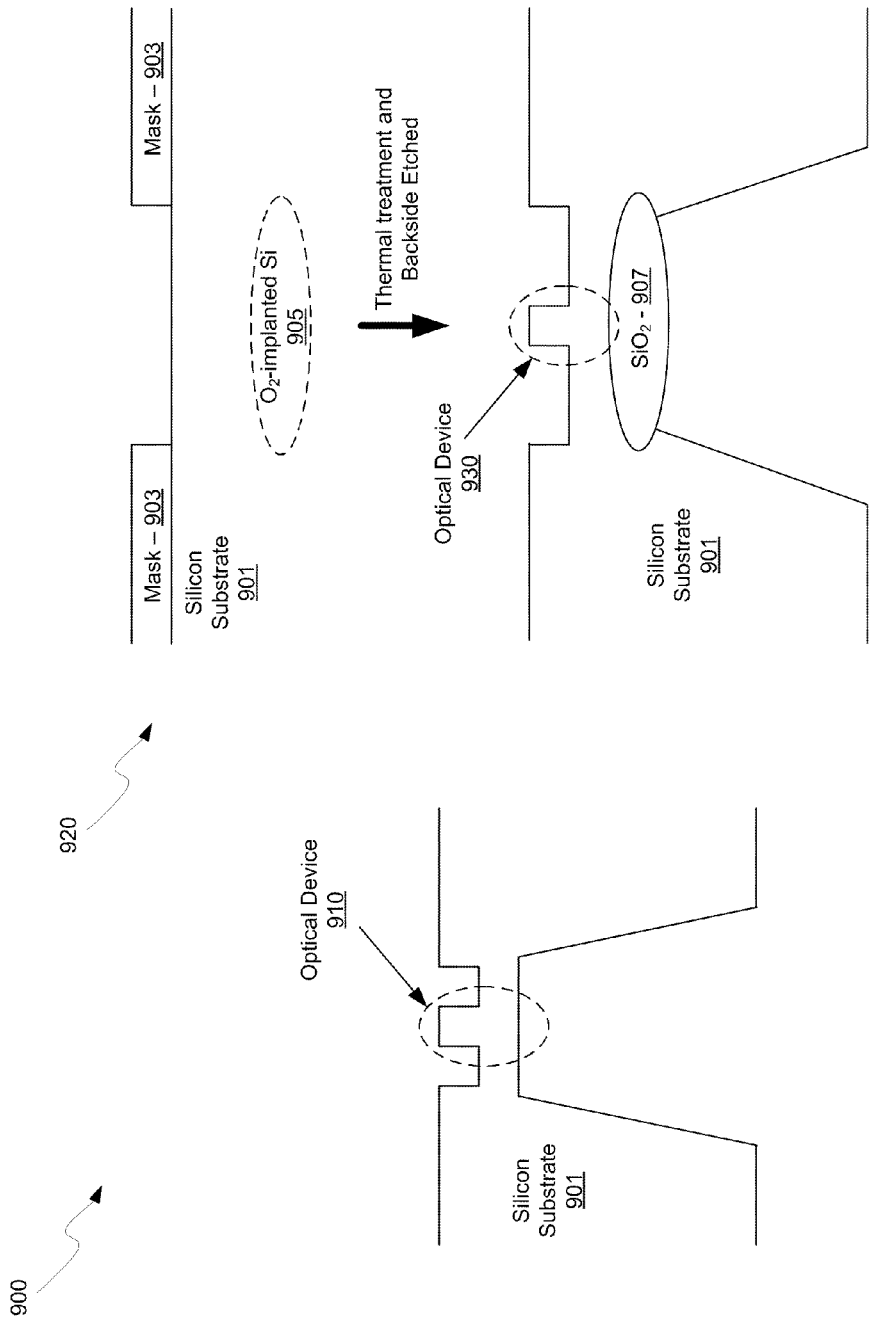
FIG. 9 is a diagram illustrating exemplary backside etch structures, in accordance with an embodiment of the invention.

FIG. 9 is a diagram illustrating exemplary backside etch structures, in accordance with an embodiment of the invention. Referring to FIG. 9, there is shown alternative backside etched devices 900 and 920. The backside etched device 900 comprises a Si substrate 901 and an optical device 910.

Silicon substrates are typically hundreds of microns thick and the thickness desired for an integrated optical device approximately 1 micron or less, indicating that a timed etch is generally not capable of leaving a controlled amount of silicon with such a starting thickness. One method in forming a backside cladding is to locally remove silicon from the substrate and leave only the thickness of silicon desired via etching, as shown in the backside etched device 900. An alternative is to polish the backside of the substrate to a much smaller thickness, leaving approximately 100 microns or less of silicon, which is still much larger than the final desired thickness and thus precludes a timed etch.

An alternative etching method is to utilize local implantation of oxygen and thermal treatment in the areas where photonic devices are desired, as described with respect to FIG. 8, to provide an etch stop layer. As shown in backside etched device 920, the $O_2$-implanted Si layer 905 is transformed into the $SiO_2$ layer 907 with thermal treatment. The $SiO_2$ layer 907 then acts as an etch stop layer, precluding the need for a precise etch time and controlled etch rate.

In an embodiment of the invention, a fast etch may be used to remove most of the silicon, followed by a different etch to accurately remove the remaining silicon and stop on the oxide or SiGe etch stop layer. The backside hole may either be left as is, with air providing the bottom cladding for a waveguide, or it may be refilled with a low index material, such as silicon dioxide or other low-k dielectric. The advantage of refilling with a low index material is the ability to control the thickness of the refill material and potentially depositing a metal mirror on the backside, which can provide huge benefits for grating coupler like devices as opposed to simply an air cladding.

In another embodiment of the invention, heavy implantation of silicon with p- or n-type implants, may be utilized to provide selectivity in etch to nominally undoped silicon.

Figure 10:
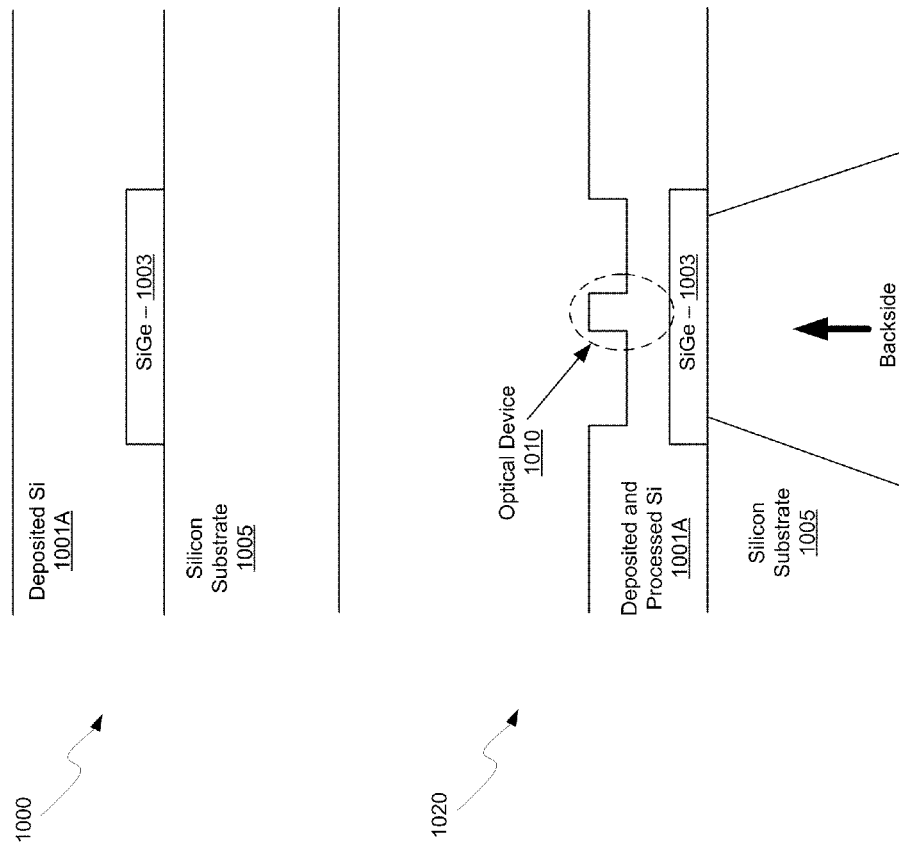
FIG. 10 is a diagram illustrating an exemplary backside etch structure, in accordance with an embodiment of the invention.

FIG. 10 is a diagram illustrating an exemplary backside etch structure, in accordance with an embodiment of the invention. Referring to FIG. 10, there is shown steps 1000 and 1020 comprising a deposited Si-layer 1001A, a SiGe layer 1003, a Si substrate 1005, a deposited and processed Si-layer 1001A.

Step 1000 illustrates the deposited Si-layer 1001A on the SiGe layer 1003 deposited on the Si substrate 1005. Step 1020 illustrates an optical device fabricated in the deposited Si-layer 1001A and the backside of the Si-substrate 1005 etched utilizing the SiGe as an etch stop.

Figure 11:
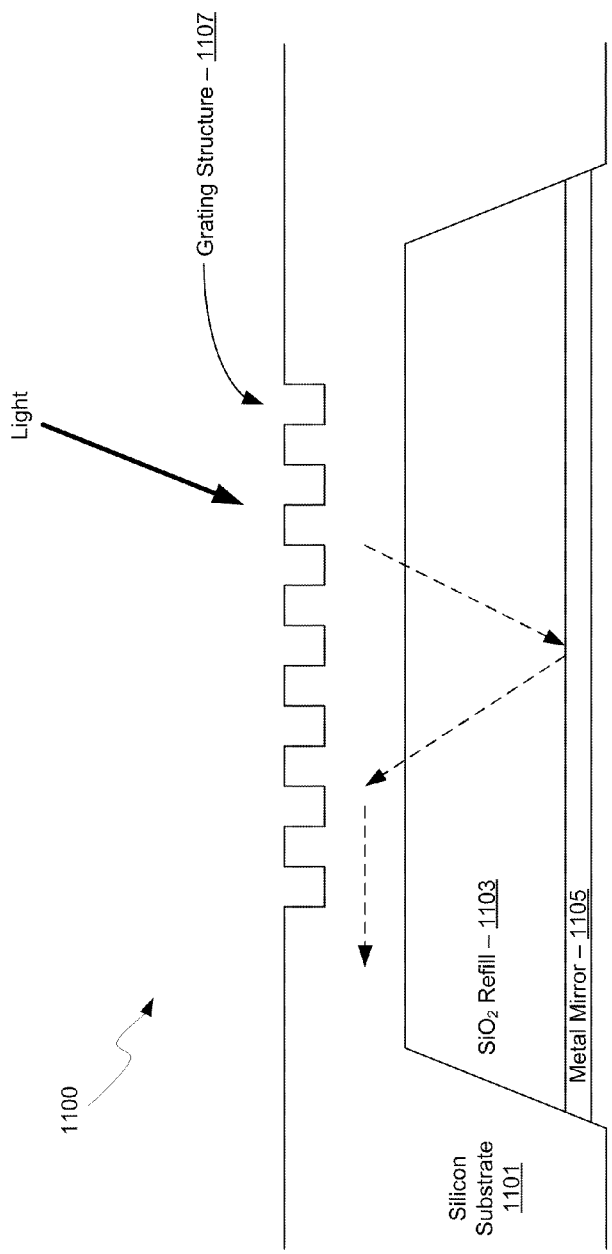
FIG. 11 is a diagram illustrating an exemplary backside etch structure with metal mirror, in accordance with an embodiment of the invention.

FIG. 11 is a diagram illustrating an exemplary backside etch structure with metal mirror, in accordance with an embodiment of the invention. Referring to FIG. 11, there is shown backside etched photonic device 1100 comprising a Si substrate 1101, a $SiO_2$ refill layer 1103, a metal mirror 1105, and a grating structure 1107.

The Si substrate may be backside etched and refilled with $SiO_2$ to form the $SiO_2$ refill layer 1103. In this manner, desired optical confinement may be obtained for optical devices integrated in the Si substrate 1101. In addition, a metal layer may be deposited, the metal mirror 1105, which may provide improved performance in grating coupler-like devices, such as increased confinement of optical modes.

In an embodiment of the invention, a method and system are disclosed for monolithic integration of photonics and electronics in CMOS processes. In this regard, photonic and electronic devices may be fabricated on a single complementary metal-oxide semiconductor (CMOS) wafer 401 with different silicon layer thicknesses 405A/405B for the photonic and the electronic devices 420 and 410, respectively. The electronic and photonic devices 410 and 420 may be fabricated on a semiconductor-on-insulator (SOI) wafer 401 utilizing a bulk CMOS process. The electronic and photonic 410 and 420 devices may be fabricated on a SOI wafer utilizing a SOI CMOS process. The different silicon layer thicknesses may be fabricated utilizing a double SOI process 300 and/or a selective area growth process 314. Cladding layers 807/907 for the photonic devices may be fabricated utilizing one or more oxygen implants into the CMOS wafer and/or utilizing CMOS trench oxide 505C/603 on the CMOS wafer. Silicon material 515 for the photonic devices may be deposited on the CMOS trench oxide 505C utilizing epitaxial lateral overgrowth. Cladding layers for the photonic devices may be fabricated utilizing selective backside etching regions of the CMOS wafer below the photonic devices. Reflective surfaces for the photonic devices may be fabricated by depositing metal 1105 on the selectively etched regions of the CMOS wafer. Silicon dioxide 907 integrated in the CMOS wafer using oxygen implant may be utilized as an etch stop layer for the backside etching. Silicon germanium 1003 integrated in the CMOS wafer may be utilized as an etch stop layer for the backside etching. Photonic and electronic devices may be fabricated on two complementary metal-oxide semiconductor (CMOS) wafers 450 and 460 with different silicon layer thicknesses for the photonic and the electronic devices by bonding at least a portion of each of the wafers together, where one of the CMOS wafers comprises the photonic devices and the other CMOS wafer comprises the electronic devices.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor processing, the method comprising:
fabricating photonic and electronic devices in a single complementary metal-oxide semiconductor (CMOS) wafer with different silicon layer thicknesses for said photonic and said electronic devices, wherein said electronic devices are formed in a silicon layer that is on top of a buried oxide layer, the buried oxide layer being on a silicon layer in which said photonic devices are formed, and wherein said photonic and electronic devices are integrated in an optoelectronic transceiver that is operable to communicate optical signals to and from said CMOS wafer.

2. The method according to claim 1, comprising fabricating said electronic and photonic devices on a semiconductor-on-insulator (SOI) wafer utilizing a CMOS implant process used for bulk silicon wafers.

3. The method according to claim 1, comprising fabricating said electronic and photonic devices on a SOI wafer utilizing a SOI CMOS process.

4. The method according to claim 3, comprising fabricating said different silicon layer thicknesses utilizing a double SOI process.

5. The method according to claim 3, comprising fabricating said different silicon layer thicknesses utilizing a selective area growth process.

6. The method according to claim 1, comprising fabricating cladding layers for said photonic devices utilizing one or more oxygen implants into said CMOS wafer.

7. The method according to claim 1, comprising fabricating cladding layers for said photonic devices utilizing CMOS trench oxide on said CMOS wafer.

8. The method according to claim 7, comprising depositing silicon material for an optical waveguide on said CMOS trench oxide utilizing epitaxial lateral overgrowth.

9. The method according to claim 1, comprising fabricating cladding layers for said photonic devices utilizing selective backside etching regions of said CMOS wafer below said photonic devices.

10. The method according to claim 9, comprising fabricating reflective surfaces for said photonic devices by depositing metal on said selectively etched regions of said CMOS wafer.

11. The method according to claim 9, comprising utilizing silicon dioxide integrated in said CMOS wafer using oxygen implant as an etch stop layer for said backside etching.

12. The method according to claim 9, comprising utilizing silicon germanium integrated in said CMOS wafer as an etch stop layer for said backside etching.

13. A system for semiconductor processing, the system comprising:
an optoelectronic transceiver comprising photonic and electronic devices fabricated in a single complementary metal-oxide semiconductor (CMOS) wafer having different silicon layer thicknesses for said photonic and said electronic devices, wherein said electronic devices are formed in a silicon layer that is on top of a buried oxide layer, the buried oxide layer being on a silicon layer in which said photonic devices are formed, and wherein said optoelectronic transceiver is operable to communicate optical signals to and from said CMOS wafer utilizing a received continuous wave optical signal as a source signal for the communicated optical signals.

14. The system according to claim 13, wherein said electronic and photonic devices are fabricated on a semiconductor-on-insulator (SOI) wafer utilizing a CMOS implant process used for bulk silicon wafers.

15. The system according to claim 13, wherein said electronic and photonic devices are fabricated on a SOI wafer utilizing a SOI CMOS process.

16. The system according to claim 15, wherein said different silicon layer thicknesses are fabricated utilizing a double SOI process.

17. The system according to claim 15, wherein said different silicon layer thicknesses are fabricated utilizing a selective area growth process.

18. The system according to claim 13, wherein cladding layers for said photonic devices are fabricated utilizing one or more oxygen implants into said CMOS wafer.

19. The system according to claim 13, wherein cladding layers for said photonic devices are fabricated utilizing CMOS trench oxide on said CMOS wafer.

20. The system according to claim 19, wherein silicon material for an optical waveguide is deposited on said CMOS trench oxide utilizing epitaxial lateral overgrowth.

21. The system according to claim 13, wherein cladding layers for said photonic devices are fabricated utilizing selective backside etching regions of said CMOS wafer below said photonic devices.

22. The system according to claim 21, wherein reflective surfaces for said photonic devices are fabricated by depositing metal on said selectively etched regions of said CMOS wafer.

23. The system according to claim 21, wherein said backside etched regions are fabricated utilizing silicon dioxide integrated in said CMOS wafer using oxygen implant as an etch stop layer.

24. The system according to claim 21, wherein said backside etched regions are fabricated utilizing silicon germanium integrated in said CMOS wafer as an etch stop layer for said backside etching.

* * * * *